United States Patent
Miyake et al.

(10) Patent No.: US 8,552,948 B2
(45) Date of Patent: Oct. 8, 2013

(54) DISPLAY DEVICE COMPRISING THRESHOLD CONTROL CIRCUIT

(75) Inventors: Hiroyuki Miyake, Kanagawa (JP); Atsushi Umezaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 858 days.

(21) Appl. No.: 12/052,307

(22) Filed: Mar. 20, 2008

(65) Prior Publication Data

US 2008/0246717 A1   Oct. 9, 2008

(30) Foreign Application Priority Data

Apr. 5, 2007 (JP) ................... 2007-098950
Aug. 31, 2007 (JP) ................... 2007-226132

(51) Int. Cl.
*G09G 3/32* (2006.01)
*G09G 3/30* (2006.01)

(52) U.S. Cl.
USPC ............... 345/92; 345/76; 345/79; 345/87

(58) Field of Classification Search
USPC .................................. 345/55–111
See application file for complete search history.

(56) References Cited

U.S. PATENT DOCUMENTS

| | | | |
|---|---|---|---|
| 6,587,086 B1 * | 7/2003 | Koyama | 345/77 |
| 6,756,816 B2 | 6/2004 | Miyake | |
| 6,891,356 B2 | 5/2005 | Kimura et al. | |
| 6,927,618 B2 | 8/2005 | Kimura et al. | |
| 6,928,136 B2 | 8/2005 | Nagao et al. | |
| 6,958,750 B2 | 10/2005 | Azami et al. | |
| 6,975,142 B2 | 12/2005 | Azami et al. | |
| 7,057,598 B2 | 6/2006 | Azami et al. | |
| 7,068,076 B2 | 6/2006 | Azami | |
| 7,123,250 B2 | 10/2006 | Kimura et al. | |
| 7,317,779 B2 | 1/2008 | Moon et al. | |
| 7,633,477 B2 | 12/2009 | Jang et al. | |

(Continued)

FOREIGN PATENT DOCUMENTS

| | | |
|---|---|---|
| EP | 1 445 862 A2 | 8/2004 |
| JP | 1-268060 | 10/1989 |

(Continued)

OTHER PUBLICATIONS

Lee, Y. et al, "16.2: Advanced TFT-LCD Data Line Reduction Method," Society for Information Display, SID 06 Digest, International Symposium Digest of Technical Papers, vol. XXXVII, 2006, pp. 1083-1086.

*Primary Examiner* — Bipin Shalwala
*Assistant Examiner* — Ryan A Lubit
(74) *Attorney, Agent, or Firm* — Husch Blackwell LLP

(57) ABSTRACT

The display device includes an output circuit, a threshold control circuit which sequentially selects one of a forward bias voltage and a reverse bias voltage, and a power supply control circuit which applies one of the forward bias voltage and the reverse bias voltage which is selected to a gate of a transistor included in the output circuit. Time in which the reverse bias voltage is applied to the gate of the transistor is determined in accordance with time in which the forward bias voltage is applied to the gate of the transistor.

24 Claims, 21 Drawing Sheets

(56) References Cited

U.S. PATENT DOCUMENTS

| | | | |
|---|---|---|---|
| 7,646,841 B2 | 1/2010 | Moon et al. | |
| 2005/0041002 A1* | 2/2005 | Takahara et al. | 345/76 |
| 2006/0022900 A1* | 2/2006 | Miyake et al. | 345/55 |
| 2007/0001945 A1* | 1/2007 | Yoshida et al. | 345/87 |
| 2007/0018933 A1* | 1/2007 | Lee | 345/98 |
| 2007/0279360 A1* | 12/2007 | Park et al. | 345/94 |
| 2008/0030434 A1* | 2/2008 | Yamazaki et al. | 345/76 |

FOREIGN PATENT DOCUMENTS

| | | |
|---|---|---|
| JP | 2-22872 | 1/1990 |
| JP | 2004-246358 | 9/2004 |
| JP | 2007-4167 | 1/2007 |
| WO | WO 2005114630 A1 * | 12/2005 |
| WO | WO 2007/010955 A1 | 1/2007 |

* cited by examiner

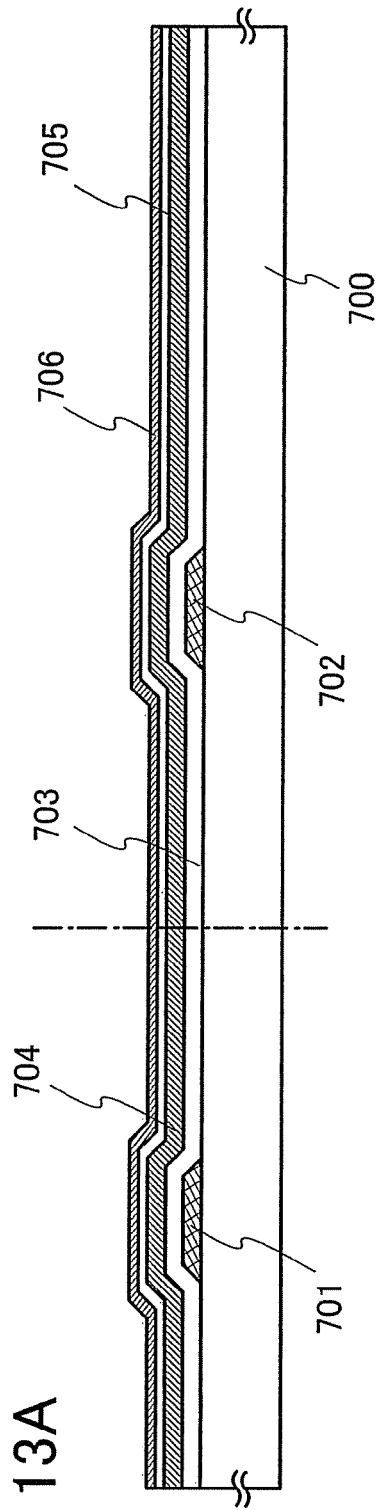
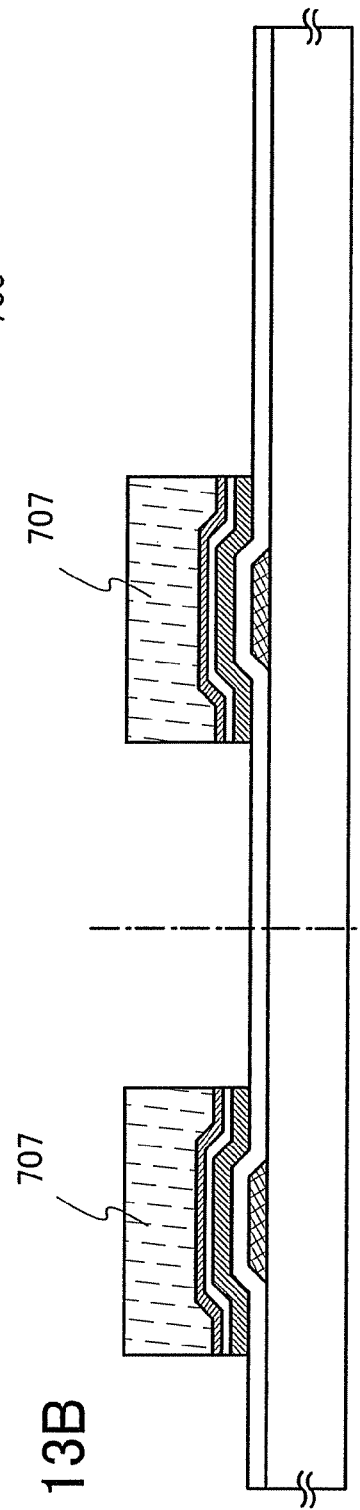
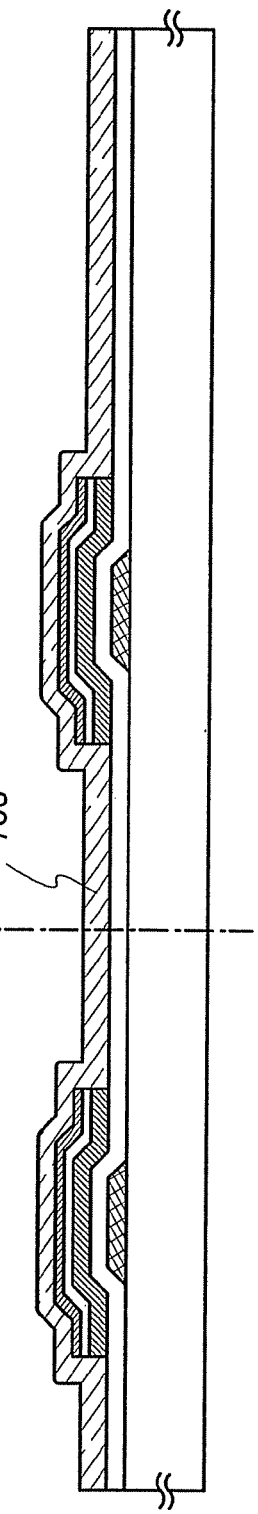
FIG. 13A
FIG. 13B
FIG. 13C

DISPLAY DEVICE COMPRISING THRESHOLD CONTROL CIRCUIT

BACKGROUND OF THE INVENTION

1. Field of the Invention

The present invention relates to a display device using a thin film transistor.

2. Description of the Related Art

Display devices formed using inexpensive glass substrates tend to be prevented from being downsized due to increase in the ratio of a region (frame region) at the periphery of a pixel portion used for mounting a driver circuit to a substrate, as the resolution increases. Accordingly, it is thought that there is a limitation on a method in which a driver circuit formed using a single crystal semiconductor substrate is mounted on a glass substrate, and a technique by which a driver circuit is formed over the same glass substrate as a pixel portion, a so-called system-on-panel is regarded as important. Realization of system-on-panel reduces the number of pins which is formed to connect a driver circuit and a pixel portion, and enables to avoid problems such as decrease in yield due to poor connection between the driver circuit and the pixel portion and low mechanical strength at a connection point using a pin when the driver circuit of a semiconductor substrate is mounted on a glass substrate. Furthermore, realization of system-on-panel enables not only downsizing of a display device but also reduction in cost due to decrease in the number of assembly steps and inspection steps.

There are a scan line driver circuit and a signal line driver circuit as typical examples of the driver circuit included in the display device. A plurality of pixels in one line or in a plurality of lines in some cases is selected at one time by the scan line driver circuit. In addition, the input of video signals to the pixels included in the selected line is controlled by the signal line driver circuit.

It is said that, of the signal line driver circuit and the scan line driver circuit, the scan line driver circuit is relatively easily formed over a glass substrate because the scan line driver circuit can suppress a driving frequency to a low level, compared with the signal line driver circuit. In Reference 1 (Yong Soon Lee, et al., "Advanced TFT-LCD Data Line Reduction Method", SOCIETY FOR INFORMATION DISPLAY 2006 INTERNATIONAL SYMPOSIUM DIGEST OF TECHNICAL PAPERS, Volume XXXVII, pp. 1083-1086, 2006), a technique is described in which a scan line driver circuit and a pixel portion are formed over a glass substrate by using a transistor by use of an amorphous semiconductor.

SUMMARY OF THE INVENTION

A thin film transistor (TFT) using an amorphous semiconductor or a polycrystalline semiconductor has a lower current supply capability than a single crystal transistor. Accordingly, to increase an on current of a TFT used for a driver circuit, an insulating film such as a silicon nitride film or a silicon nitride oxide film which has a higher dielectric constant than that of a silicon oxide film can be adopted as a gate insulating film of the TFT.

However, a threshold voltage of a thin film transistor using a gate insulating film containing nitrogen largely shifts as an absolute value of a voltage applied to a gate is large and as on-state time (driving time) is long. This is because charges are trapped in the gate insulating film when a voltage is applied to the gate. In particular, in the case where a thin film transistor using an amorphous semiconductor is used, there are many cases in which an insulating film containing nitrogen is used for a gate insulating film; therefore, a shift of a threshold voltage due to trapping of charges is a serious problem.

In FIG. 18A, a general configuration of an output circuit which is formed to control the input of a voltage to a scan line, which is used for a scan line driver circuit, is shown. The output circuit shown in FIG. 18A includes an n-channel transistor 3001 and an n-channel transistor 3002 which are connected in series. A voltage of a clock signal GCLK is applied to either one of a source and a drain of the transistor 3001. A power supply voltage VSS is applied to a source of the transistor 3002. A voltage Vin1 is applied to a gate of the transistor 3001. A voltage Vin2 is applied to a gate of the transistor 3002. A voltage Vout of a node where the other of the source and the drain of the transistor 3001 and a drain of the transistor 3002 are connected is applied to a scan line.

A timing chart of input voltages and an output voltage in the output circuit shown in FIG. 18A is shown in FIG. 18B. As shown in FIG. 18B, the voltage Vin1 is at a high level only right before, during, and right after a period when one of pulses at a high level included in the clock signal GCLK appears. The transistor 3001 is turned on when the Vin1 is made at a high level, and the transistor 3001 is turned off when the Vin1 is made at a low level.

Meanwhile, the voltage Vin2 is at a low level only right before, during, and right after a period when one of pulses at a high level included in the clock signal GCLK appears. The transistor 3002 is turned off when the Vin2 is made at a low level, and the transistor 3002 is turned on when the Vin2 is made at a high level. In a period when the transistor 3001 is on and the transistor 3002 is off, a high level pulse included in the clock signal GCLK is sampled and output as the voltage Vout. With the sampled pulse, selection of a scan line is performed.

In an output circuit having the above configuration, the transistor 3002 maintains the on state in a period when a scan line is not selected. Therefore, the period when the scan line is not selected is overwhelmingly longer than a period when the scan line is selected. Accordingly, driving time of the transistor 3002 is longer than that of the transistor 3001, and a threshold voltage of the transistor 3002 easily shifts by trapping of charges in the gate insulating film. Since the transistor 3002 does not operate normally when the threshold voltage largely shifts, trapping of charges in the gate insulating film contributes to shortening the life of the scan line driver circuit.

In view of the foregoing problems, an object of the present invention is to provide a display device which can ensure high reliability of a driver circuit even when a threshold voltage of a TFT shifts.

The present inventors focus attention on the fact that a threshold voltage of a transistor shifts in a positive direction when a positive voltage continues to be applied to a gate of the transistor, and that the threshold voltage of the transistor shifts in a negative direction when a negative voltage continues to be applied. The present inventors suggest a display device which compensates a threshold voltage by application of a voltage having a reverse polarity to the gate so that the threshold voltage shifts in a reverse direction even when the threshold voltage of the transistor of an output circuit shifts.

The display device of the present invention includes a power supply control circuit which can apply a forward bias voltage or a reverse bias voltage to a gate of a transistor included in an output circuit with respect to a potential of a source of the transistor, and a threshold control circuit which controls the power supply control circuit in such a way that the reverse bias voltage with respect to the potential of the source of the transistor is applied to the gate of the transistor so as to compensate the threshold voltage of the transistor.

The threshold control circuit can control time in which a reverse bias voltage is applied to the gate of the transistor in accordance with driving time of the transistor. Specifically, the threshold control circuit predicts the amount of change ΔVth of a threshold voltage from time (driving time) t in which a forward bias voltage is applied to the gate of the transistor. Then, from the mount of change ΔVth, time t' in which a reverse bias voltage is applied to the gate, which is necessary to change the threshold voltage in the reverse direction just by the amount of ΔVth, is calculated. Then, the power supply control circuit is controlled so that the reverse bias voltage is applied to the gate of the transistor just for the calculated time t'.

The amount of change ΔVth of the threshold voltage in the threshold control circuit can be estimated in such a way that data on a change of the amount of change ΔVth with respect to the driving time t is stored in advance in a memory and the data is referred to. Similarly, the time t' in which the reverse bias voltage is applied can be calculated in such a way that data on a change of the amount of change ΔVth of the threshold voltage with respect to time in which a reverse bias voltage is applied is stored in advance in a memory and the data is referred to.

Alternatively, from the two pieces of data, data of the time t' in which a reverse bias voltage is applied with respect to the driving time t may be determined and stored in advance in a memory.

Measured driving time may be stored in a memory so that driving time can be continuously measured even if the supply of power is cut off when a power supply of a display device is turned off and then the power supply is turned on again.

Scan line driver circuits provided with an output circuit may be arranged in a plurality of portions with respect to a pixel portion of a display device, specifically, in two portions which are located on both sides of a scan line that drives a pixel. One output circuit is operated to display an image on a pixel, and the other output circuit is operated so that a reverse bias voltage is applied; accordingly, a threshold voltage of a transistor can be compensated without suspending display of an image on a pixel portion.

Note that a threshold voltage can be compensated by using a reverse bias voltage any time other than a period when an image is displayed on a pixel portion. For example, the threshold voltage can be compensated in the period after power of a display device is supplied until an image is displayed in practice, or the threshold voltage can be compensated by suspending display as appropriate even while an image is being displayed.

In the present invention, even when a threshold voltage of the transistor used for the driver circuit shifts, a shifted threshold voltage can be restored by application of a reverse bias voltage to the gate of the transistor. Accordingly, reliability of a driver circuit and thus reliability of a display device can be increased. In particular, in a thin film transistor using an amorphous semiconductor film, silicon nitride or silicon nitride oxide which has a higher dielectric constant than that of silicon oxide is used for a gate insulating film in many cases to have a sufficient on current. When silicon nitride or silicon nitride oxide which has a high dielectric constant is used, charges are easily trapped, which leads to the shift of a threshold voltage. However, with the configuration of the present invention, the threshold voltage of the thin film transistor can be compensated and reliability of the display device can be increased.

In addition, in the present invention, when scan line driver circuits provided with an output circuit are arranged in a plurality of portions with respect to a pixel portion of a display device, specifically, in two portions which are located on both sides of a scan line that drives a pixel, a threshold voltage of a transistor can be compensated without suspending display of an image on a pixel portion, and reliability of the display device can be increased.

BRIEF DESCRIPTION OF THE DRAWINGS

FIGS. 13A to 13C are diagrams showing a method for manufacturing a display device in accordance with an Embodiment of the present invention.

FIGS. 21A to 20C are diagrams each showing an appearance of a display device in accordance with an Embodiment Mode of the present invention.

DETAILED DESCRIPTION OF THE INVENTION

Hereinafter, embodiment modes and embodiments of the present invention will be described with reference to the accompanying drawings. However, the present invention can be implemented in various modes. As can be easily understood by those skilled in the art, the modes and details of the present invention can be changed in various ways without departing from the spirit and scope of the present invention. Thus, the present invention should not be interpreted as being limited to the following description of the embodiment modes and embodiments.

(Embodiment Mode 1)

Figure 1A:
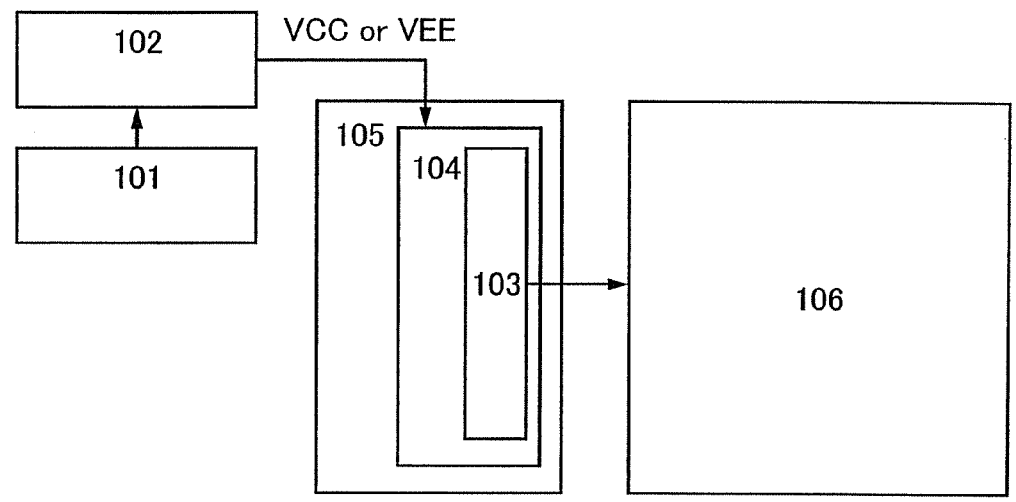
FIGS. 1A and 1B are block diagrams showing a configuration of a display device in accordance with an Embodiment Mode of the present invention.
Figure 1B:
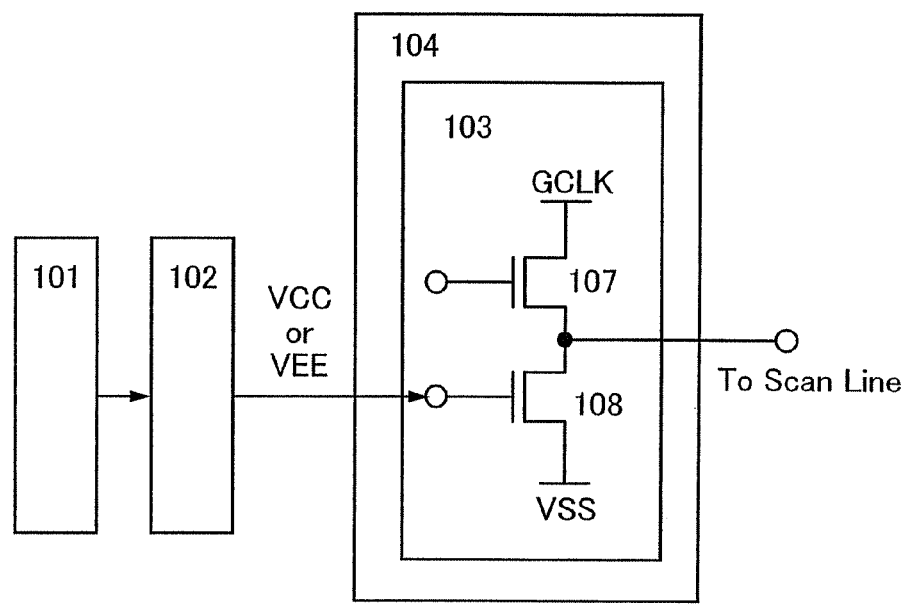

A configuration of a display device of the present invention will be described with reference to FIGS. 1A and 1B. FIG. 1A is a block diagram of the display device of the present invention. The display device of the present invention includes a threshold control circuit 101, a power supply control circuit 102, and an output circuit 103. The display device of the present invention shown in FIG. 1A further includes a shift register 104 having the output circuit 103, a scan line driver circuit 105 having the shift register 104, and a pixel portion 106. In addition to the above configuration, the display device of the present invention may also include a signal line driver circuit.

The pixel portion 106 is provided with a plurality of pixels, and the pixels are selected per line by the scan line driver circuit 105. A signal line driver circuit controls the input of a video signal to the pixels of the line selected by the scan line driver circuit 105.

The shift register 104 selects a line using a clock signal GCLK and a start pulse signal GSP which are input. Specifically, switching of the output circuit 103 is controlled in accordance with the start pulse signal GSP and the clock signal GCLK, so that a pulse of the clock signal GCLK is sampled and supplied to a scan line.

In the case where an n-channel transistor is used as a switching element in the pixel, when a high-level voltage VDD of a pulse is supplied to the scan line, the transistor is turned on, and the pixels of the scan line are made in a selected state. When a low-level voltage VSS is supplied to the scan line, the transistor is turned off, and the pixels of the scan line are made in a non-selected state.

Meanwhile, in the case where a p-channel transistor is used as a switching element in the pixel, when the low-level voltage VSS of a pulse is supplied to the scan line, the transistor is turned on, and the pixels of the scan line are made in a selected state. When the high-level voltage VDD is supplied to the scan line, the transistor is turned off, and the pixels of the scan line are made in a non-selected state.

Next, the case where an n-channel transistor is used as a switching element in the pixel is given as an example. Configurations and operations of the threshold control circuit 101, the power supply control circuit 102, the output circuit 103, and the shift register 104 will be described with reference to a block diagram shown in FIG. 1B.

The output circuit 103 includes at least two switching elements. Specifically, the output circuit 103 shown in FIG. 1B uses an n-channel transistor 107 and an n-channel transistor 108 as the switching elements. Note that, in FIG. 1B, the case where both the transistor 107 and the transistor 108 are n-channel transistors is exemplified; however, the present invention is not limited to this configuration. Both the transistor 107 and the transistor 108 may be p-channel transistors.

The transistor 107 and the transistor 108 are connected in series. In a period when an image is displayed on the pixel portion 106, a voltage of the clock signal GCLK is applied to either one of a source and a drain of the transistor 107, and the other of the source and the drain of the transistor 107 is connected to the scan line. The voltage VSS is applied to a source of the transistor 108, and a drain of the transistor 108 is connected to the scan line. Accordingly, the clock signal GCLK is sampled by the transistor 107, and the supply of the voltage VSS to the scan line is controlled by the transistor 108.

The power supply control circuit 102 can apply either one of a high-level voltage VCC and a low-level voltage VEE to the shift register 104. The threshold control circuit 101 selects one of the voltage VCC and the voltage VEE and controls the power supply control circuit 102 so that the selected voltage is applied to the shift register 104.

In the period when an image is displayed on the pixel portion 106, the threshold control circuit 101 controls the power supply control circuit 102 so that the voltage VCC is applied to the shift register 104. Note that the voltage VCC is set to be lower than the voltage VDD. The transistor 108 is turned on when the voltage VCC which is a forward bias voltage is applied to a gate of the transistor 108. When the transistor 108 is turned on, the voltage VSS is applied to the scan line, and a transistor functioning as a switching element of the pixel is turned off, whereby the pixels of the scan line are made in a non-selected state. Meanwhile, in the period when an image is displayed on the pixel portion 106, the transistor 107 performs switching in such a way that the transistor 107 is turned on when the voltage VDD is applied to a gate of the transistor 107 and the transistor 107 is turned off when the voltage VSS is applied to the gate of the transistor 107. The transistor 108 is turned off when the transistor 107 is on, and the transistor 108 is turned on when the transistor 107 is off.

Note that a threshold voltage shifts in a positive direction when a period when the high-level voltage VCC is applied to the gate of the transistor 108 is increased. Accordingly, in the display device of the present invention, a period when a threshold voltage of the transistor 108 is compensated is provided.

In a period when the threshold voltage of the transistor 108 is compensated, the threshold control circuit 101 controls the power supply control circuit 102 so that the reverse bias voltage VEE is applied to the shift register 104. The voltage VEE is set to be lower than the voltage VSS. The threshold voltage of the transistor 108 shifts in a negative direction by applying of the voltage VEE which is a reverse bias voltage to the gate of the transistor 108. The amount of change of the threshold voltage in the negative direction may be determined in accordance with the amount of change of the threshold voltage in the positive direction in a period when an image is displayed.

The amount of change of the threshold voltage in the positive direction can be estimated by using time (driving time) in which a forward bias voltage VCC is applied to the gate of the transistor 108. In addition, the amount of change of the threshold voltage in the negative direction can be estimated from the time in which the reverse bias voltage VEE is applied to the gate of the transistor 108. Accordingly, in accordance with the time in which the forward bias voltage VCC is applied to the gate of the transistor 108, the time in which the reverse bias voltage VEE is applied to the gate of the transistor 108 can be determined.

A threshold voltage can be compensated any time other than a period when an image is displayed on the pixel portion 106. For example, the threshold voltage can be compensated in the period after power of the display device is supplied until an image is displayed in practice, or the threshold voltage can be compensated by suspending display as appropriate even while an image is being displayed.

A period when the scan line is not selected is overwhelmingly longer than a period when the scan line is selected;

therefore, driving time of the transistor 108 is overwhelmingly longer than driving time of the transistor 107, and the amount of change of the threshold voltage of the transistor 108 increases. However, in the present invention, by applying of a reverse bias voltage to the gate of the transistor 108, the threshold voltage thereof can be compensated. Accordingly, reliability of the scan line driver circuit 105 and thus reliability of the display device can be increased. In particular, in a thin film transistor using an amorphous semiconductor film, silicon nitride or silicon nitride oxide which has a higher dielectric constant than that of silicon oxide is used for a gate insulating film in many cases to have a sufficient on current. When silicon nitride or silicon nitride oxide which has a high dielectric constant is used, charges are easily trapped, which leads to the shift of a threshold voltage. However, with the configuration of the present invention, the threshold voltage of the transistor 108 can be compensated and reliability of the display device can be increased.

In this embodiment mode, the case where n-channel transistors are used as switching elements of the pixel and the output circuit 103 is described as an example, and a configuration in which the threshold voltage of the transistor 108 is compensated is described. Meanwhile, the case where p-channel transistors are used as switching elements of the pixel and the output circuit 103 is considered below. In this case, a voltage of the clock signal GCLK is applied to either one of the source and the drain of the transistor 107, and the other of the source and the drain of the transistor 107 is connected to the scan line. The voltage VDD is applied to the source of the transistor 108; and the drain of the transistor 108 is connected to the scan line. Therefore, the supply of the voltage VDD to the scan line is controlled by the transistor 108, and the clock signal GCLK is sampled by the transistor 107. In order to turn off the transistor of the pixel, it is necessary to turn on the transistor 108 in the output circuit 103 and to apply the high-level voltage VDD to the scan line. Accordingly, the driving time of the transistor 108 is overwhelmingly longer than that of the transistor 107; therefore, a high-level reverse bias voltage is applied to the gate of the transistor 108 so as to compensate the threshold voltage of the transistor 108.

In this embodiment mode, a configuration of the output circuit 103 in which the transistor 107 and the transistor 108 have the same polarity is described; however, the present invention is not limited to this configuration. The transistor 107 and the transistor 108 may have different polarities. In this case, it is preferable that the voltage VDD be applied to a source when a p-channel transistor is used and the voltage VSS be applied to a source when an n-channel transistor is used; therefore, a p-channel transistor is preferably used for the transistor 107 and an n-channel transistor is preferably used for the transistor 108.

In this embodiment mode, the case where each of the transistor 107 and the transistor 108 has a single-gate structure provided with one gate is shown; however, the present invention is not limited to this structure. A transistor having a multi-gate structure provided with a plurality of gates which are electrically connected to each other may be used.

(Embodiment Mode 2)

Figure 2:
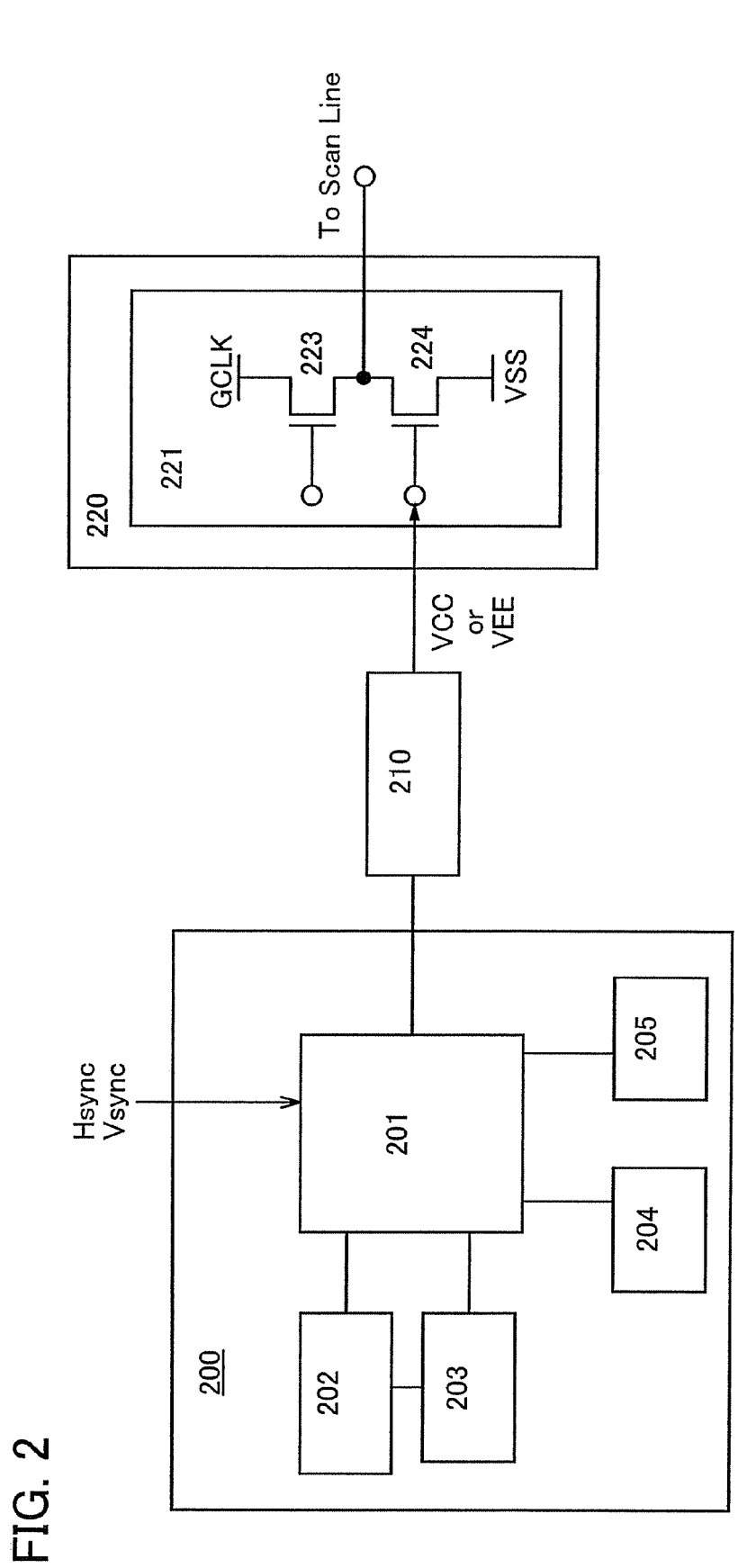
FIG. 2 is a block diagram showing a configuration of a threshold control circuit.

In this embodiment mode, an example of a specific configuration of a threshold control circuit included in the display device of the present invention will be described. A threshold control circuit 200 shown in FIG. 2 includes a controller 201, an arithmetic circuit 202, a measurement circuit 203, a memory 204, and a memory 205.

An output circuit 221 included in a shift register 220 includes a transistor 223 and a transistor 224 which are connected in series. In a period when an image is displayed on a pixel portion, a voltage of a clock signal GCLK is applied to either one of a source and a drain of the transistor 223, and the other thereof is connected to a scan line. A voltage VSS is applied to a source of the transistor 224, and a drain of the transistor 224 is connected to the scan line. Therefore, the clock signal GCLK is sampled by the transistor 223, and the supply of the voltage VSS to the scan line is controlled by the transistor 224.

Next, the operation of a display device of this embodiment mode will be described. First, in a period when an image is displayed on the pixel portion, the controller 201 controls a power supply control circuit 210 so as to apply a forward bias voltage (here, a voltage VCC) to the output circuit 221. A period when an image is displayed can be determined using a horizontal synchronizing signal (Hsync) and a vertical synchronizing signal (Vsync) which are input to the controller 201. When the forward bias voltage VCC is applied to a gate of the transistor 224, the transistor 224 is turned on, and the voltage VSS is applied to the scan line. Then, as time passes, a threshold voltage of the transistor 224 shifts in a positive direction.

Note that, in a period when an image is displayed, the controller 201 controls the measurement circuit 203 so as to measure time t in which the forward bias voltage VCC is applied to the gate of the transistor 224. The measurement circuit 203 can be formed using a counting circuit such as a counter. The measured time t is stored in the memory 204. A nonvolatile memory is preferably used for the memory 204. Note that a volatile memory may be used as long as data can be stored by always applying a power supply voltage to the memory 204. For the memory 204, an SRAM, a DRAM, a flash memory, an EEPROM, a FeRAM, or the like can be used, for example. Time t in which a forward bias voltage is applied to the memory 204 is stored so that, after a power supply of a display device is turned off and then the power supply is turned on again, time after power supply is supplied can be added to the time t before a power supply is turned off.

Next, in a period when the threshold voltage of the transistor 224 is compensated, the controller 201 controls the power supply control circuit 210 so as to apply a reverse bias voltage (here, a voltage VEE) to the output circuit 221. When the voltage VEE is applied to the gate of the transistor 224, the transistor 224 is turned off, and the threshold voltage shifts in a negative direction as time passes.

Note that, in the memory 205, data for calculating time t' to compensate the threshold voltage of the transistor 224 from the time t is stored. In this embodiment mode, the case where first data showing a value or the amount of change of the threshold voltage of the transistor 224 with respect to the time t and second data showing a value or the amount of change of the threshold voltage of the transistor 224 with respect to the time t' are stored will be described as an example.

Figure 3A:
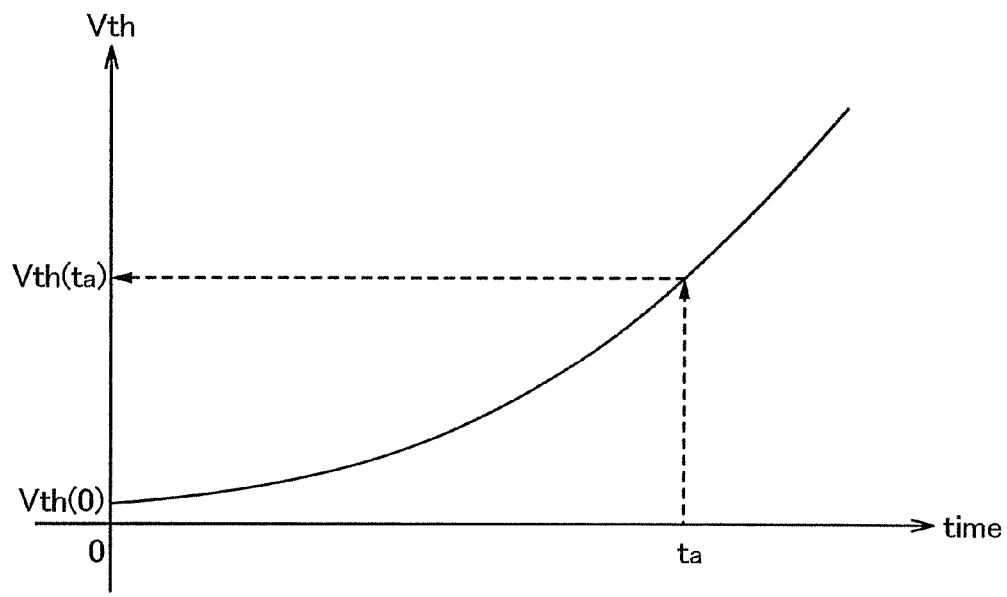
FIG. 3A is a graph showing a change of a threshold voltage with respect to time in which a forward bias is applied.

In FIG. 3A, an example of the first data showing a value of a threshold voltage Vth with respect to the time t in which a forward bias voltage is applied to the gate of the transistor 224 is shown. In FIG. 3A, the threshold voltage before a forward bias voltage is applied, namely, at the time of 0 is Vth(0). In FIG. 3A, the threshold voltage at the time in which time $t=t_a$ is satisfied is $Vth(t_a)$.

Figure 3B:
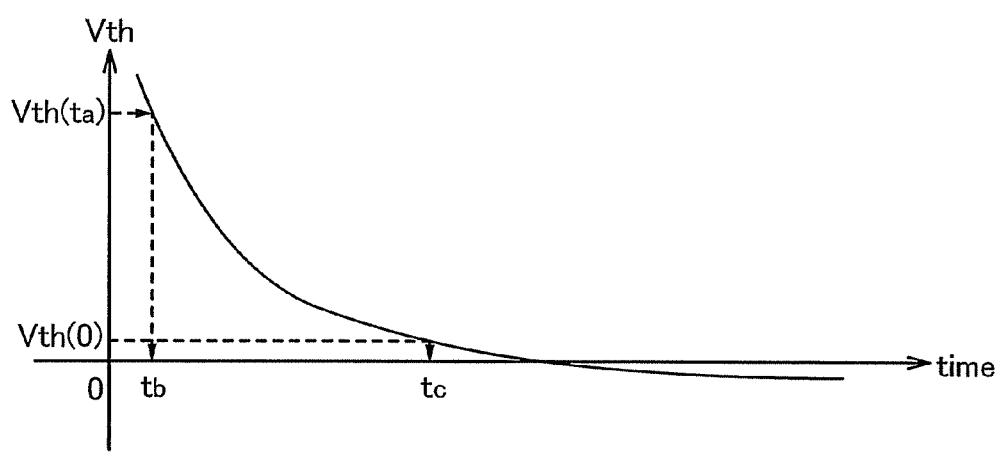
FIG. 3B is a graph showing a change of a threshold voltage with respect to time in which a reverse bias is applied.

In FIG. 3B, an example of the second data showing a value of a threshold voltage Vth with respect to the time t' in which a reverse bias voltage is applied to the gate of the transistor 224 is shown. In FIG. 3B, the threshold voltage is $Vth(t_a)$ at the time of time $t_b$, and the threshold voltage is $Vth(0)$ at the time of time $t_c$. Thus, it is found that a reverse bias voltage is applied just for time $t'=(t_c-t_b)$ in order that the threshold voltage is returned from $Vth(t_a)$ to $Vth(0)$.

The controller 201 controls the arithmetic circuit 202 in such a way that the time t' in which a reverse bias voltage is applied is calculated by using the first data or the second data stored in the memory 205 and the time t measured in the measurement circuit 203. Then, the controller 201 controls the power supply control circuit 210 so as to apply the reverse bias voltage VEE to the output circuit 221 in accordance with time $t'=(t_c-t_b)$ which is calculated in the arithmetic circuit 202.

Note that, in this embodiment mode, a nonvolatile memory is preferably used for the memory 205. Note that a volatile memory may be used as long as data can be stored by always applying a power supply voltage to the memory 205. For the memory 205, an SRAM, a DRAM, a flash memory, an EEPROM, a FeRAM, or the like can be used, for example. In this embodiment mode, although an example in which the first data and the second data are stored in the same memory 205 is described, the present invention is not limited to this configuration. The first data and the second data may be stored in different memories.

In this embodiment mode, the case where time t' in which a reverse bias voltage is applied is calculated using the first data and the second data is exemplified; however, the present invention is not limited to this configuration. For example, data in which time t' is directly calculated using the driving time t may be formed by using the first data and the second data and stored in the memory.

In this embodiment mode, although the time t in which a forward bias voltage is applied to the gate of the transistor is measured in the measurement circuit 203, the present invention is not limited to this configuration. Without directly measuring the time t in which the forward bias voltage is applied to the gate of the transistor, a factor from which the time t can be indirectly estimated may be measured. For example, a period when the forward bias voltage is selected in the threshold control circuit 200 and the time t in which the forward bias voltage is applied in practice to the gate of the transistor are different from each other. However, it is possible to indirectly predict the time t in which the forward bias voltage is applied in practice to the gate of the transistor, from the period when the forward bias voltage is selected in the threshold control circuit 200. Accordingly, a period when the forward bias voltage is selected in the threshold control circuit 200 is calculated so that the time t' in which a reverse bias voltage is applied can be calculated.

Note that, in this embodiment mode, data in which a value or the amount of change of a threshold voltage is continuously changed with respect to the time t or the time t' is used; however, the present invention is not limited to this configuration. Data in which a value or the amount of change of the threshold voltage is intermittently changed with respect to the time t or the time t' may be used.

In the present invention, a reverse bias voltage is applied to the gate of the transistor 224 in the output circuit 221 just for time which is determined in accordance with the driving time so that the threshold voltage is compensated. Accordingly, even when charges are trapped in a gate insulating film and the threshold voltage Vth of the transistor 224 shifts, reliability of the scan line driver circuit and thus reliability of the display device can be secured. In particular, in a thin film transistor using an amorphous semiconductor film, silicon nitride or silicon nitride oxide which has a higher dielectric constant than that of silicon oxide is used for a gate insulating film in many cases to have a sufficient on current. When silicon nitride or silicon nitride oxide which has a high dielectric constant is used, charges are easily trapped, which leads to the shift of a threshold voltage. However, with the configuration of the present invention, a shift of the threshold voltage can be compensated and reliability of the display device can be increased.

This embodiment mode can be combined with the above embodiment mode, as appropriate.

(Embodiment Mode 3)

In this embodiment mode, a more detailed configuration and the operation of the scan line driver circuit included in the semiconductor device of the present invention will be described.

Figure 4A:
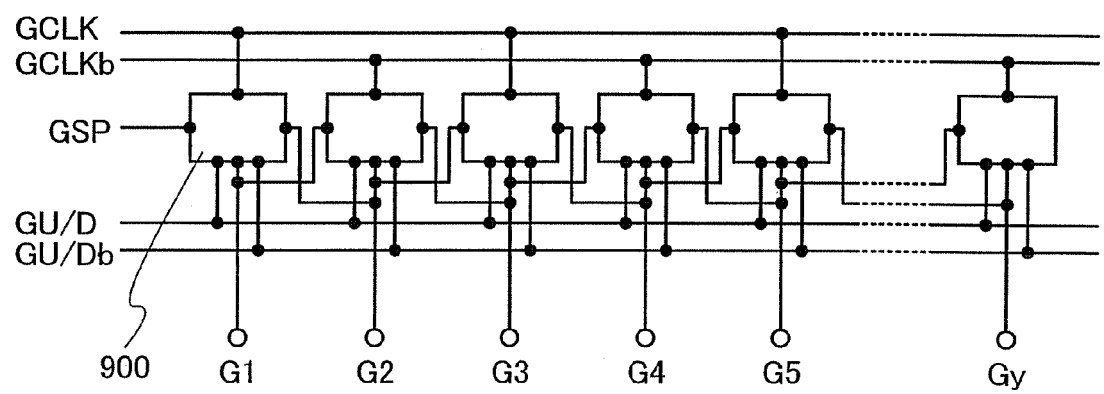
FIGS. 4A and 4B are diagrams showing a configuration of a scan line driver circuit.

A configuration of a scan line driver circuit of this embodiment mode is shown in FIG. 4A. The scan line driver circuit shown in FIG. 4A includes a plurality of pulse output circuits 900. A clock signal GCLK, a clock signal GCLKb which is shifted by half a period of the clock signal GCLK, a start pulse signal GSP, a scanning direction switching signal GU/D, and a scanning direction switching signal GU/Db in which a voltage of the scanning direction switching signal GU/D is inverted are input to the pulse output circuits 900. Each of the plurality of pulse output circuits 900 sequentially outputs a pulse to a corresponding one of scan lines G1 to Gy by the input of the above signals.

Figure 4B:
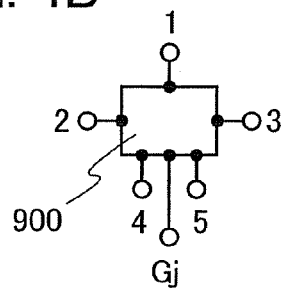
Figure 5:
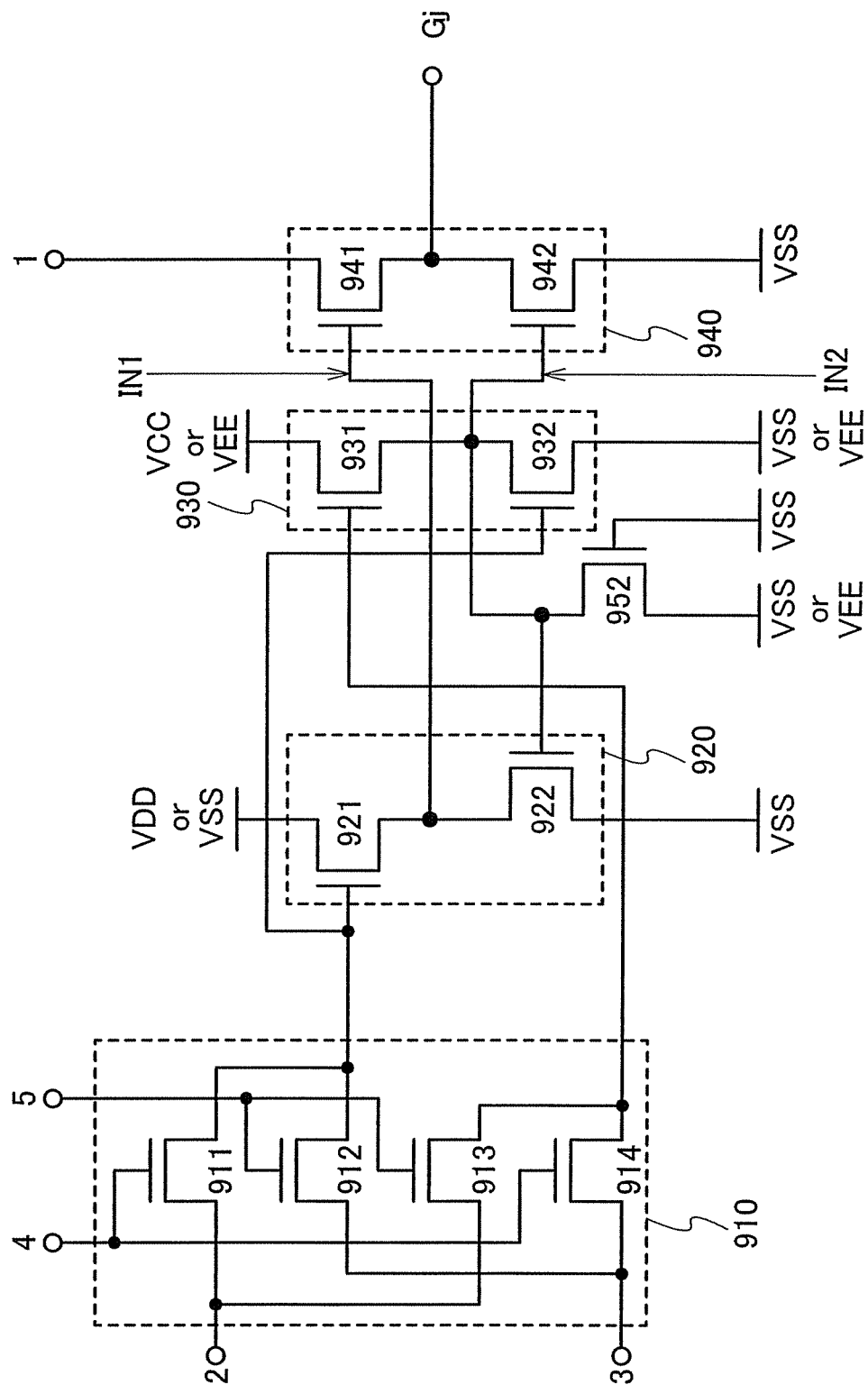
FIG. 5 is a diagram showing a configuration of a pulse output circuit.

An example of a specific circuit diagram of the pulse output circuit 900 is shown in FIG. 5. Note that, to clarify the input and the output of a signal in the pulse output circuit shown in FIG. 5, terminals of the pulse output circuit 900 shown in FIG. 4A which are denoted by the numbers 1 to 5 are shown in FIG. 4B. The terminals 1 to 5 of the pulse output circuit 900 shown in FIG. 4B correspond to the terminals 1 to 5 of the pulse output circuit shown in FIG. 5.

The pulse output circuit shown in FIG. 5 includes a scan direction switching circuit 910, a first amplitude compensation circuit 920, a second amplitude compensation circuit 930, an output circuit 940, and a switching element 952. The scan direction switching circuit 910 can switch a selection order of scan lines in accordance with the scanning direction switching signal U/D and the scanning direction switching signal U/Db. The first amplitude compensation circuit 920 and the second amplitude compensation circuit 930 control the switching of the output circuit 940 in accordance with the start pulse signal GSP or a pulse output from a pulse output circuit which is the previous stage, and a pulse output from a pulse output circuit which is the next stage. The output circuit 940 samples a pulse of the clock signal GCLK or the clock signal GCLKb and outputs the pulse to the pulse output circuit which is the previous stage or the scan line Gj (j=one of 1 to y). The switching element 952 controls the supply of a forward bias voltage or a reverse bias voltage to the output circuit 940.

Specifically, the scan direction switching circuit 910 includes transistors 911 to 914. The first amplitude compensation circuit 920 includes a transistor 921 and a transistor 922. The second amplitude compensation circuit 930 includes a transistor 931 and a transistor 932. The output circuit 940 includes a transistor 941 and a transistor 942. Note that the switching element 952 uses only one transistor in FIG. 5; however, the present invention is not limited to this configuration. The switching element 952 may use a plurality of transistors, or a semiconductor element other than a transistor may be used.

A gate of the transistor 911 is connected to the terminal 4. One of a source and a drain of the transistor 911 is connected to the terminal 2, and the other thereof is connected to a gate of the transistor 921 and a gate of the transistor 932. A gate of the transistor 912 is connected to the terminal 5. One of a source and a drain of the transistor 912 is connected to the terminal 3, and the other thereof is connected to the gate of the transistor 921 and the gate of the transistor 932. A gate of the transistor 913 is connected to the terminal 5. One of a source and a drain of the transistor 913 is connected to the terminal 2, and the other thereof is connected to a gate of the transistor 931. A gate of the transistor 914 is connected to the terminal 4. One of a source and a drain of the transistor 914 is connected to the terminal 3, and the other thereof is connected to the gate of the transistor 931.

A voltage VDD or a voltage VSS is applied to either one of a source and a drain of the transistor 921, and the other thereof is connected to a gate of the transistor 941. A gate of the transistor 922 is connected to a gate of the transistor 942. One of a source and a drain of the transistor 922 is connected to the gate of the transistor 941, and the voltage VSS is applied to the other thereof.

A voltage VCC or a voltage VEE is applied to either one of a source and a drain of the transistor 931, and the other thereof is connected to the gate of the transistor 922 and the gate of the transistor 942. One of a source and a drain of the transistor 932 is connected to the gate of the transistor 922 and the gate of the transistor 942, and the voltage VSS or the voltage VEE is applied to the other thereof.

One of a source and a drain of the transistor 941 is connected to the terminal 1, and the other thereof is connected to the scan line Gj. One of a source and a drain of the transistor 942 is connected to the scan line Gj, and the voltage VSS is applied to the other thereof.

The voltage VSS is applied to a gate of a transistor of the switching element 952. One of a source and a drain of the transistor of the switching element 952 is connected to the gate of the transistor 922 and the gate of the transistor 942, and the voltage VSS or the voltage VEE is applied to the other thereof.

Figure 6:
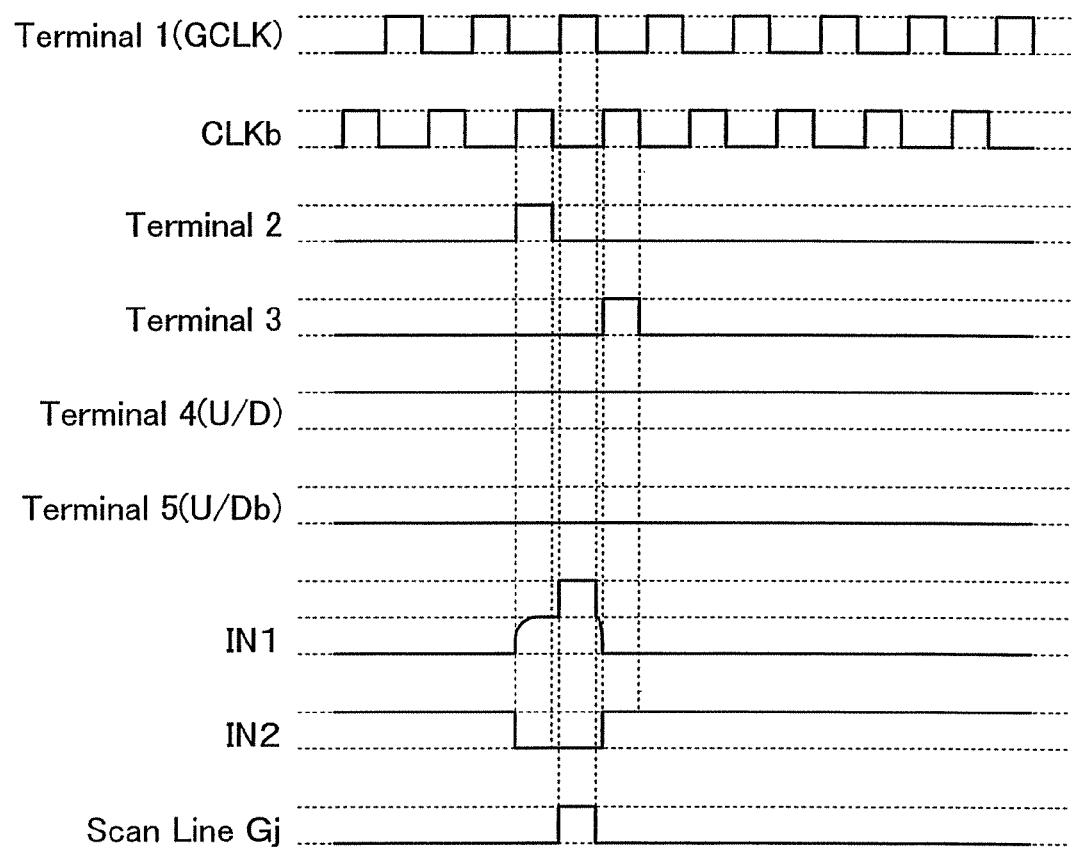
FIG. 6 is a timing chart of a pulse output circuit.

In FIG. 6, a timing chart of voltages of the terminals 1 to 5 and the scan line Gj in the pulse output circuit 900 shown in FIG. 6 in a period when an image is displayed on a pixel portion is shown. A timing chart of a voltage IN1 input to the gate of the transistor 941 and a voltage IN2 input to the gate of the transistor 942 is also shown in FIG. 6.

First, in a period when an image is displayed, as shown in FIG. 6, a case where a voltage of the scanning direction switching signal U/D which is to be input to the terminal 4 is at high level and a voltage of the scanning direction switching signal U/Db which is to be input to the terminal 5 is at low level is shown. Accordingly, the transistor 911 and the transistor 914 are on, and the transistor 912 and the transistor 913 are off. On the other hand, even when a voltage of the scanning direction switching signal U/D is at low level and a voltage of the scanning direction switching signal U/Db is at high level, just a scanning direction is switched and a basic operation is the same.

In the period when an image is displayed, the voltage VDD is applied to the one of the source and the drain of the transistor 921. The voltage VCC is applied to the one of the source and the drain of the transistor 931. The voltage VSS is applied to the other of the source and the drain of the transistor 932. The voltage VSS is applied to the other of the source and the drain of the transistor of the switching element 952.

Then, as shown in FIG. 6, a voltage which is to be input to the terminal 2 and the terminal 3 is at low level before a pulse of the start pulse signal GSP is input to the terminal 2. Accordingly, all of the transistor 921, the transistor 931, and the transistor 932 are off. In addition, the transistor of the switching element 952 is off. Therefore, the voltage applied in a previous period is held in the gate of the transistor 941 and the gate of the transistor 942.

Next, when the pulse of the start pulse signal GSP is input to the terminal 2, a high-level voltage is applied to the gate the transistor 921 and the gate of the transistor 932; accordingly, the above transistors are turned on. Since the voltage VDD is applied to the gate of the transistor 941 as the voltage IN1 through the transistor 921, the transistor 941 is turned on. Since the voltage VSS is applied to the gate of the transistor 942 as the voltage IN2 through the transistor 932, the transistor 942 is turned off. In addition, the transistor of the switching element 952 maintains the off state. At this time, since a voltage of the clock signal GCLK which is to be input to the terminal 1 is at low level, a low-level voltage is output to the scan line Gj.

Further, since a voltage input to the terminal 3 remains at low level, the transistor 931 maintains the off state. Since the voltage VSS is applied to the gate of the transistor 922 through the transistor 932, the transistor 922 is turned off.

Next, when a low-level voltage is input to the terminal 2 again, a low-level voltage is applied to the gate of the transistor 921 and the gate of the transistor 932; accordingly, the above transistors are turned off. Since the voltage input to the terminal 3 remains at low level, the transistor 931 maintains the off state. Since the gate of the transistor 922 and the gate of the transistor 942 are made in a floating state and the voltage IN2 maintains the low-level state, the transistor 922 and the transistor 942 are turned off. In addition, the transistor of the switching element 952 remains the off state.

At this time, although the gate of the transistor 941 is also made in the floating state, since a voltage of the clock signal GCLK which is to be input to the terminal 1 becomes high level, the voltage IN1 of the gate of the transistor is further increased with a bootstrap. Since the transistor 941 maintains the on state, a high-level voltage of the clock signal GCLK is sampled and is output to the scan line Gj.

Next, since the voltage which is to be input to the terminal 2 maintains the low-level state, the transistor 921 and the transistor 932 remain the off state. Meanwhile, since the voltage which is to be input to the terminal 3 becomes high level, the transistor 931 is turned on. Then, the voltage VCC is applied to the gate of the transistor 922 through the transistor 931 so that the transistor 922 and the transistor 942 are turned on. Accordingly, the voltage VSS is applied to the gate of the transistor 941 as the voltage IN1 through the transistor 922, and the transistor 941 is turned off. In addition, the voltage VCC is applied to the gate of the transistor 942 as the voltage IN2 through the transistor 931. The transistor of the switching element 952 remains the off state. Accordingly, the transistor 942 is turned on, and the voltage VSS is applied to the scan line Gj through the transistor 942.

Next, the operation of the pulse output circuit 900 in a period when a threshold voltage of the transistor 942 is compensated will be described. In the period when a threshold voltage is compensated, since the input of the clock signal GCLK, the clock signal GCLKb, the start pulse signal GSP, the scanning direction switching signal U/D, and the scanning direction switching signal U/Db to the signal line driver circuit stops, the voltage VSS is applied to the terminals 1 to 5. The voltage VSS is applied to the one of the source and the drain of the transistor 921. The voltage VEE is applied to the one of the source and the drain of the transistor 931. The voltage VEE is applied to the other of the source and the drain of the transistor 932. The voltage VEE is applied to the other of the source and the drain of the transistor of the switching element 952.

Consequently, the transistor 921 and the transistor 922 are turned off, the transistor 931 and the transistor 932 are turned off, and the transistor 941 and the transistor 942 are turned off. Then, the transistor of the switching element 952 is turned on, the reverse bias voltage VEE is applied to the gate of the transistor 942, and the threshold voltage of the transistor 942 is compensated.

Note that, in order to turn off the transistor 941 surely in the period when a threshold voltage is compensated, the voltage VSS may be applied to the gate of the transistor 941, or the voltage VSS may be applied to the scan line Gj in the period when a threshold voltage is compensated.

Figure 7:
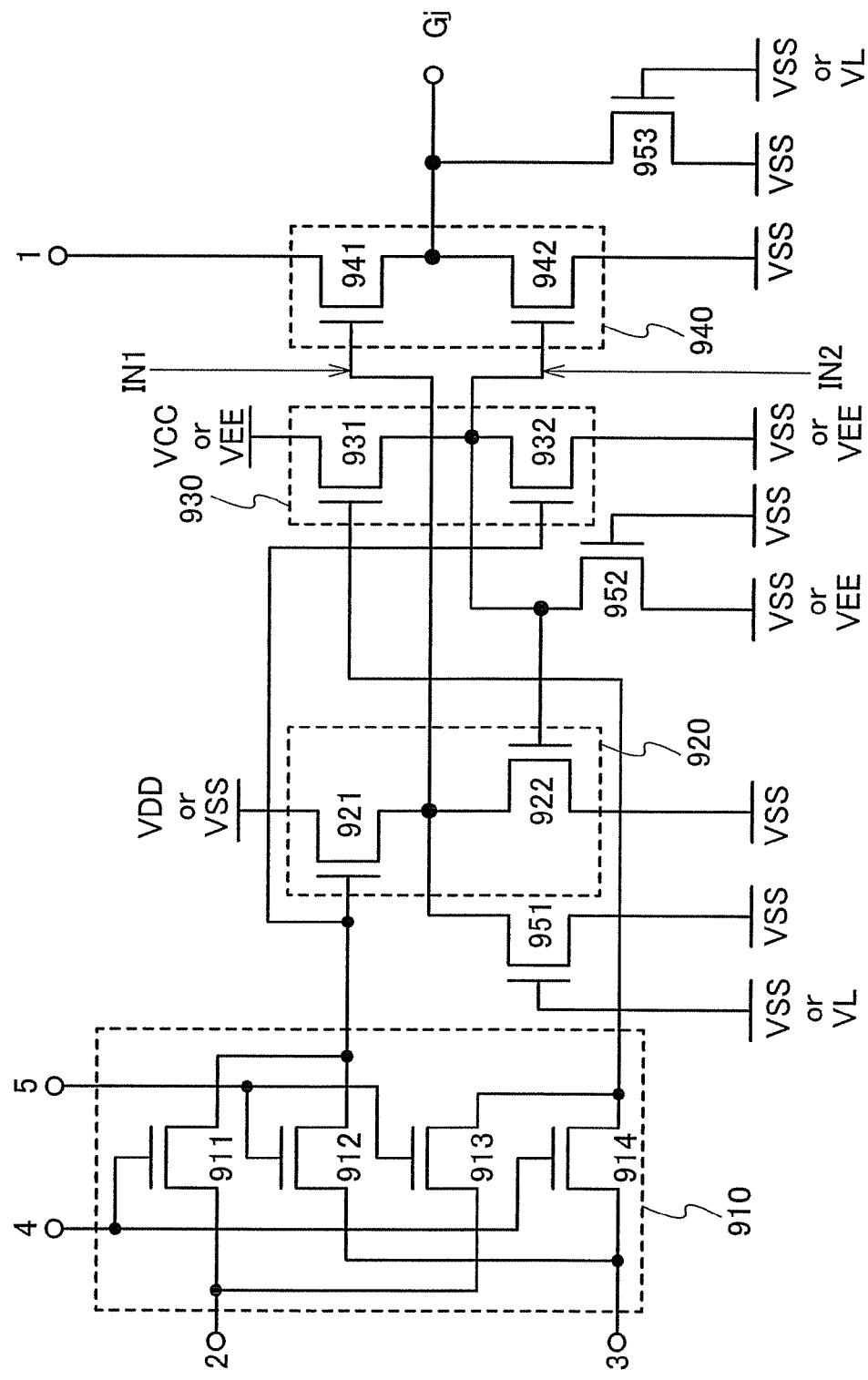
FIG. 7 is a diagram showing a configuration of a pulse output circuit.

In FIG. 7, a configuration of the pulse output circuit 900 further including a switching element 951 which controls application of the voltage VSS to the gate of the transistor 941 and a switching element 953 which controls application of the voltage VSS to the scan line Gj is shown. In FIG. 7, the switching element 951 uses only one transistor; however, the present invention is not limited to this configuration. The switching element 951 may use a plurality of transistors, or a semiconductor element other than a transistor may be used. In FIG. 7, the switching element 953 uses only one transistor; however, the present invention is not limited to this configuration. The switching element 953 may use a plurality of transistors, or a semiconductor element other than a transistor may be used.

The voltage VSS or a voltage VL is applied to a gate of a transistor of the switching element 951. One of a source and a drain of the transistor of the switching element 951 is connected to the gate of the transistor 941, and the voltage VSS is applied to the other thereof. The voltage VSS or the voltage VL is applied to a gate of a transistor of the switching element 953. One of a source and a drain of the transistor of the switching element 953 is connected to the scan line Gj, and the voltage VSS is applied to the other thereof.

In a period when an image is displayed, since the voltage VSS is applied to the gate of the transistor of the switching element 951 and the gate of the transistor of the switching element 953, the transistor of the switching element 951 and the transistor of the switching element 953 are turned off. Meanwhile, in a period when the threshold voltage of the transistor 942 is compensated, the voltage VL is applied to the gate of the transistor of the switching element 951 and the gate of the transistor of the switching element 953. The voltage VL has a level as high as the transistor of the switching element 951 and the transistor of the switching element 953 are turned on. Accordingly, the voltage VSS is applied to the gate of the transistor 941 through the transistor of the switching element 951 which has turned on. The voltage VSS is applied to the scan line Gj through the transistor of the switching element 953 which has turned on.

Note that the switching element 951 and the switching element 953 are not necessarily provided. However, by providing the switching element 951 or the switching element 953, the voltage of the scan line Gj can be reliably set at the voltage VSS in the period when compensation is performed.

Note that, in this embodiment mode, a configuration in which the pulse output circuit 900 includes the scan direction switching circuit 910 is described; however, the present invention is not limited to this configuration. The scan direction switching circuit 910 is not necessarily provided as long as a selection order of scan lines does not need to be switched.

This embodiment mode can be combined with the above embodiment modes, as appropriate.

(Embodiment Mode 4)

Figure 8:
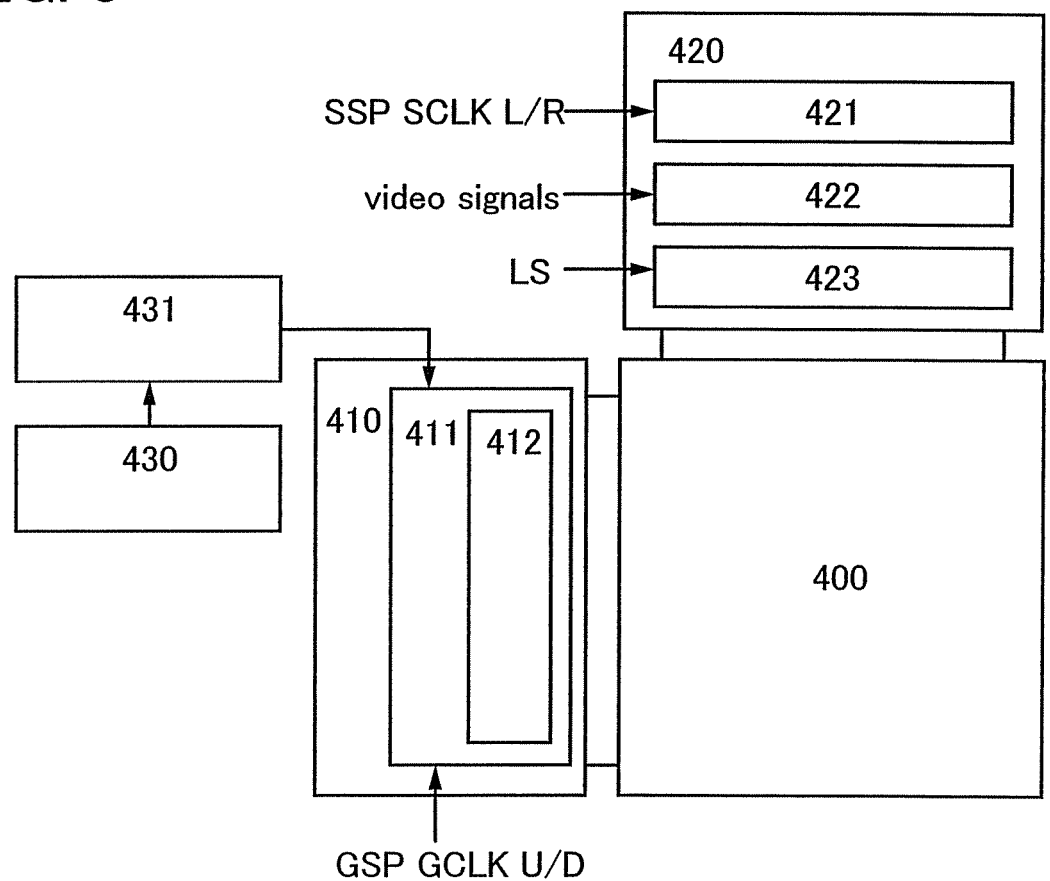
FIG. 8 is a block diagram showing a configuration of a display device in accordance with an Embodiment Mode of the present invention.

In this embodiment mode, an overall configuration of the display device of the present invention will be described. In FIG. 8, a block diagram of a display device of this embodiment mode is shown. The display device shown in FIG. 8 includes a pixel portion 400 having a plurality of pixels each provided with a display element, a scan line driver circuit 410 for selecting pixels per line, a signal line driver circuit 420 for controlling the input of a video signal to pixels of a selected line, a threshold control circuit 430, and a power supply control circuit 431.

In FIG. 8, the signal line driver circuit 420 includes a shift register 421, a first latch 422, and a second latch 423. A clock signal SCLK, a start pulse signal SSP, and a scanning direction switching signal L/R are input to the shift register 421. The shift register 421 generates a timing signal of which pulse sequentially shifts in accordance with the clock signal SCLK and the start pulse signal SSP and outputs the timing signal to the first latch 422. The order of the appearance of the pulses of the timing signal is switched in accordance with the scanning direction switching signal L/R.

When a timing signal is input to the first latch 422, a video signal is sequentially written into and held in the first latch 422 in accordance with a pulse of the timing signal. Note that, although a video signal is sequentially written into a plurality of memory circuits included in the first latch 422 in this embodiment mode, the present invention is not limited to this configuration. The plurality of memory circuits included in the first latch 422 may be divided into some groups, and video signals may be input to group by group in parallel, that is, a so-called division driving may be performed. Note that the number of groups at this time is called a division number. For example, in the case where the memory circuits are divided into groups such that each group has four memory circuits, division driving is performed with four divisions.

The time until video signal writing into all of the memory circuits of the first latch 422 is completed is called a line period. In practice, a line period may include a period when a horizontal retrace interval is added to the line period.

When one line period is completed, the video signal held in the first latch 422 is written into the second latch 423 all at once and held in accordance with a pulse of a latch signal LS which is to be input to the second latch 423. The next video signal is sequentially written into the first latch 422 which has finished sending the video signals to the second latch 423, in accordance with a timing signal from the shift register 421 again. During this second round of the one line period, the video signals written into and held in the second latch 423 are input to the pixel portion 400.

Note that the signal line driver circuit 420 may use another circuit which can output a signal of which pulse sequentially shifts instead of the shift register 421.

Note that, although the pixel portion 400 is directly connected to the second latch 423 in FIG. 8, the present invention is not limited to this configuration. A circuit which performs signal processing on the video signal output from the second latch 423 can be provided at a stage prior to the pixel portion 400. As examples of the circuit which performs signal processing, a buffer which can shape a waveform, a level shifter which can amplify the amplitude, a digital-to-analog converter circuit which can convert a digital signal into an analog signal, and the like can be given.

Next, a configuration of the scan line driver circuit 410 will be described. The scan line driver circuit 410 includes a shift register 411, and the shift register 411 includes an output circuit 412. The threshold control circuit 430 controls the power supply control circuit 431 so as to apply a forward bias voltage or a reverse bias voltage to the scan line driver circuit 410.

In the scan line driver circuit 410, when a clock signal GCLK, a start pulse signal GSP, a scanning direction switching signal U/D, and a forward bias voltage are input to the shift register 411, a selection signal of which pulse sequentially shifts is output from the output circuit 412. The order of the appearance of pulses of the selection signal is switched in accordance with the scanning direction switching signal U/D. When a generated pulse of the selection signal is input to the scan line, pixels of the scan line are selected, and a video signal is input to the pixels.

In the scan line driver circuit 410, a threshold voltage of a transistor in the output circuit 412 is compensated when a reverse bias voltage is applied.

Note that the pixel portion 400 is directly connected to the shift register 411 in FIG. 8; however, the present invention is not limited to this configuration. A circuit which performs signal processing on the selection signal output from the shift register 411 may be provided at the stage prior to the pixel portion 400. As examples of the circuit which performs signal processing, a buffer which can shape a waveform, a level shifter which can amplify the amplitude, and the like are given.

Further, in the case of an active matrix display device, gates of transistors included in pixels for one line are connected to the scan line. Accordingly, in the case where the pixel portion 400 is directly connected to the shift register 411, it is preferable that transistors having current supply capability as high as transistors of pixels for one line can be turned on all at once be used in the output circuit 412.

Note that the pixel portion 400, the scan line driver circuit 410, and the signal line driver circuit 420 can be formed over the same substrate; however, any of them can be formed over a different substrate.

Figure 9A:
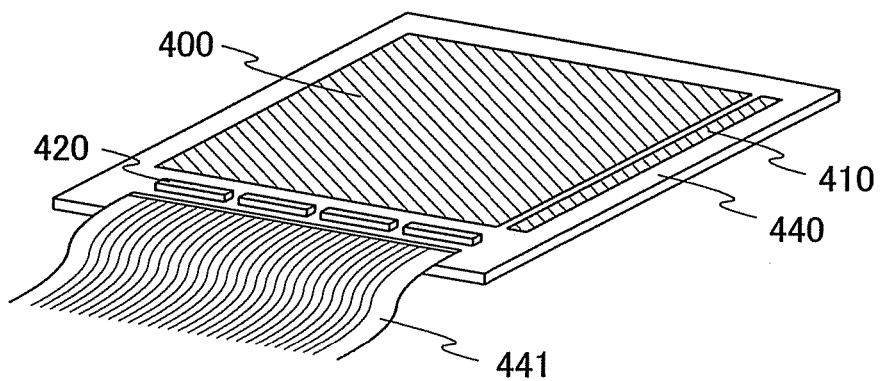
FIGS. 9A to 9C are diagrams each showing an appearance of a display device in accordance with an Embodiment Mode of the present invention.

In FIG. 9A, one mode of a display device in which the signal line driver circuit 420 formed separately is mounted on a substrate 440 provided with the pixel portion 400 and the scan line driver circuit 410 is shown. Note that, in practice, another substrate is provided to sandwich the pixel portion 400 between the substrate and the substrate 440; however, a mode in which the substrate is not shown is illustrated in FIG. 9A to clarify the arrangement of the pixel portion 400, the scan line driver circuit 410, and the signal line driver circuit 420.

A voltage of a power supply, various signals, and the like are supplied to the pixel portion 400, the signal line driver circuit 420, and the scan line driver circuit 410 through an FPC 441. The threshold control circuit 430 or the power supply control circuit 431 and the scan line driver circuit 410 are electrically connected to each other through the FPC 441. In FIG. 9A, the signal line driver circuit 420 may have a transistor using a single crystal semiconductor, a transistor using a polycrystalline semiconductor, or a transistor using an SOI (silicon on insulator).

Figure 9B:
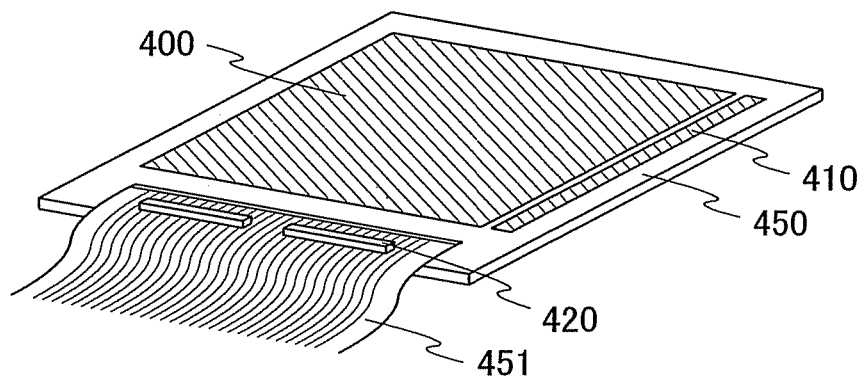

Note that when the signal line driver circuit 420 is mounted, a substrate provided with the signal line driver circuit 420 is not necessarily attached on a substrate provided with the pixel portion 400, and for example, the substrate provided with the signal line driver circuit 420 may be attached on the FPC. In FIG. 9B, one mode of a display device, in which the signal line driver circuit 420 formed separately is mounted on a substrate 450 provided with the pixel portion 400 and the scan line driver circuit 410 in such a way that the signal line driver circuit 420 is attached on an FPC 451, is shown. Note that, in practice, another substrate is provided to sandwich the pixel portion 400 between the substrate and the substrate 450; however, a mode in which the substrate is not shown is illustrated in FIG. 9B to clarify the arrangement of the pixel portion 400, the scan line driver circuit 410, and the signal line driver circuit 420. A voltage of a power supply, various signals, and the like are supplied to the pixel portion 400, the signal line driver circuit 420, and the scan line driver circuit 410 through the FPC 451. The threshold control circuit 430 or the power supply control circuit 431 and the scan line driver circuit 410 are electrically connected to each other through the FPC 451. In FIG. 9B, the signal line driver circuit 420 may have a transistor using a single crystal semiconductor, a transistor using a polycrystalline semiconductor, or a transistor using an SOI.

Figure 9C:
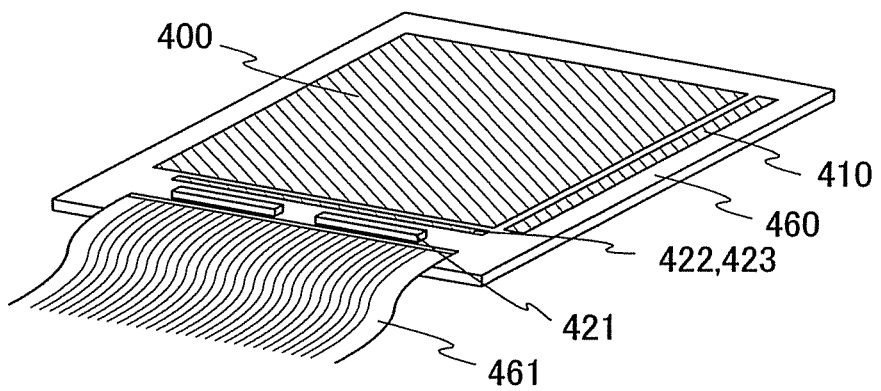

Alternatively, part of the signal line driver circuit may be formed over the same substrate as the pixel portion 400 and the scan line driver circuit 410, and the other thereof may be separately formed and mounted. One mode of a display device, in which the shift register 421 of the signal line driver circuit 420 which is formed separately is mounted on a substrate 460 provided with the first latch 422 and the second latch 423 included in the signal line driver circuit 420 in addition to the pixel portion 400 and the scan line driver circuit 410, is shown in FIG. 9C. Note that, in practice, another substrate is provided to sandwich the pixel portion 400 between the substrate and the substrate 460; however, a mode in which the substrate is not shown is illustrated in FIG. 9C to clarify the arrangement of the pixel portion 400, the scan line driver circuit 410, and the signal line driver circuit 420. A voltage of a power supply, various signals, and the like are supplied to the pixel portion 400, the signal line driver circuit 420, and the scan line driver circuit 410 through an FPC 461. The threshold control circuit 430 or the power supply control circuit 431 and the scan line driver circuit 410 are electrically connected to each other through the FPC 461. In FIG. 9C, the signal line driver circuit 420 may have a transistor using a single crystal semiconductor, a transistor using a polycrystalline semiconductor, or a transistor using an SOI.

Note that there is no particular limitation on a connection method of the substrate formed separately, and a known COG method, wire bonding method, TAB method, or the like can be used. Also, a position for connection is not limited to the position shown in FIGS. 9A to 9C as long as electrical connection is possible. Alternatively, a controller, a CPU, a memory, and/or the like may be formed separately to be connected.

By separately forming an integrated circuit such as a driver circuit and mounting on a substrate, yield can be improved and optimization of a process according to characteristics of each circuit can be easily performed, as compared with a case of forming all circuits over a same substrate as a pixel portion.

Note that as the display device of the present invention, an active matrix display device such as a liquid crystal display device, a light-emitting device provided with a light-emitting element typified by an organic light-emitting diode (OLED) in each pixel, a DMD (digital micromirror device), a PDP (plasma display panel), or an FED (field emission display) is included in its category. In addition, a passive matrix display device is included in its category.

This embodiment mode can be combined with the above embodiment modes, as appropriate.

(Embodiment Mode 5)

Figure 19:
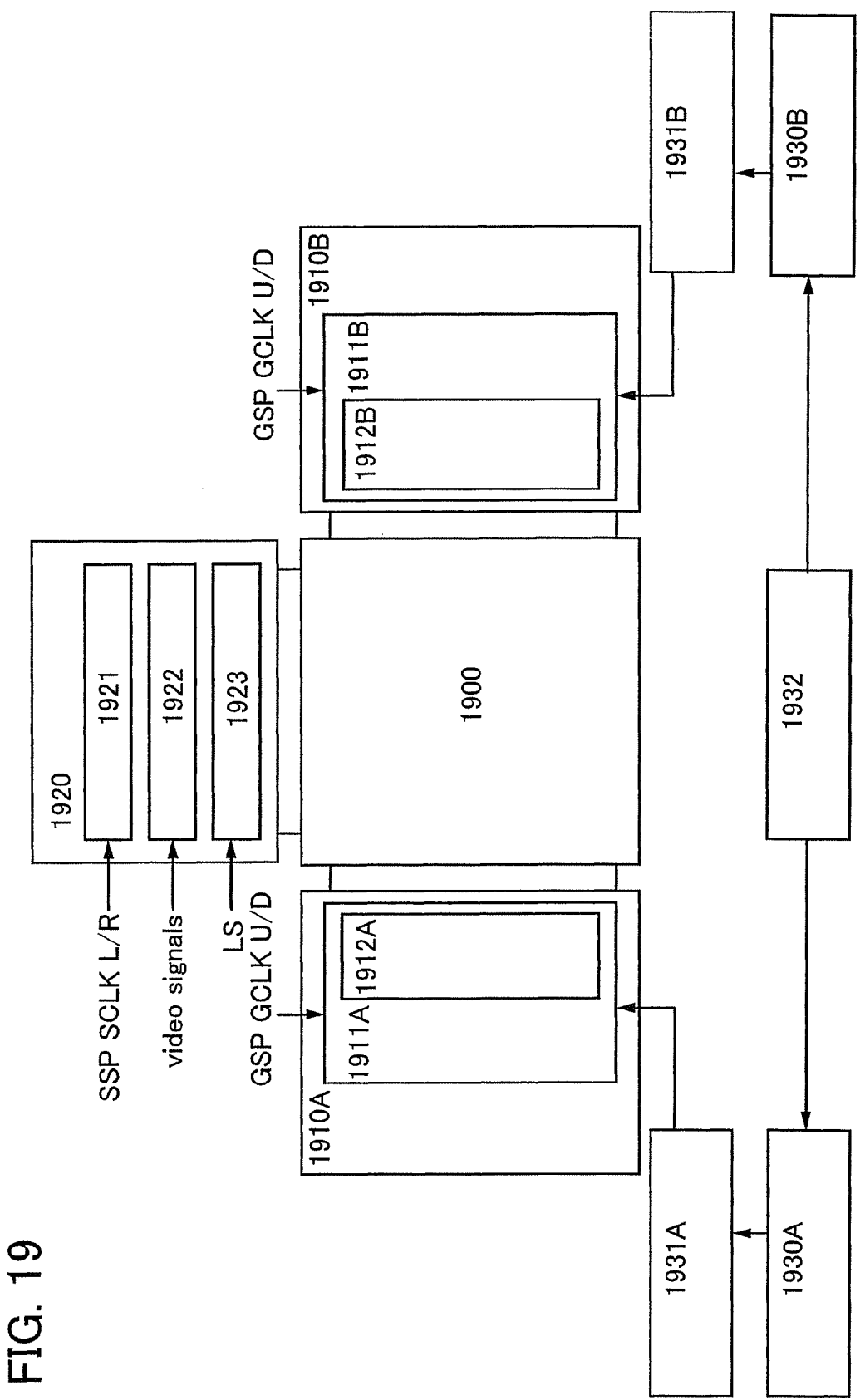
FIG. 19 is a block diagram showing a configuration of a display device in accordance with an Embodiment Mode of the present invention.

In this embodiment mode, an overall configuration of a display device of the present invention, which is different from the configuration described in Embodiment Mode 4, will be described. In FIG. 19, a block diagram of a display device of this embodiment mode is shown. The display device shown in FIG. 19 includes a pixel portion 1900 including a plurality of pixels each provided with a display element; a first scan line driver circuit 1910A and a second scan line driver circuit 1910B each of which selects pixels per line; a signal line driver circuit 1920 that controls the input of a video signal to a pixel of a selected line; a first threshold control circuit 1930A; a second threshold control circuit 1930B; a first power supply control circuit 1931A; a second power supply control circuit 1931B; and a scan line drive control circuit 1932.

In FIG. 19, the signal line driver circuit 1920 includes a shift register 1921, a first latch 1922, and a second latch 1923. To the shift register 1921, a clock signal SCLK, a start pulse signal SSP, and a scanning direction switching signal L/R are input. In accordance with the clock signal SCLK and the start pulse signal SSP, the shift register 1921 generates timing signals of which pulses sequentially shift and outputs them to the first latch 1922. The order of the appearance of pulses of the timing signal is switched in accordance with the scanning direction switching signal L/R.

When a timing signal is input to the first latch 1922, a video signal is sequentially written into and held in the first latch 1922 in accordance with a pulse of the timing signal. Note that, although a video signal is sequentially written into a plurality of memory circuits included in the first latch 1922 in this embodiment mode, the present invention is not limited to this configuration. The plurality of memory circuits included in the first latch 1922 may be divided into some groups, and video signals may be input to group by group in parallel, that is, a so-called division driving may be performed. Note that the number of groups at this time is called a division number. For example, in the case where the memory circuits are divided into groups such that each group has four memory circuits, division driving is performed with four divisions.

The time it takes to write video signals to all of the memory circuits of the first latch 1922 is called a line period. In practice, a line period sometimes refers to a period when a horizontal retrace interval is added to the line period.

When one line period is completed, in accordance with a pulse of a latch signal LS input to the second latch 1923, the video signals held in the first latch 1922 are written all at once into the second latch 1923 and held. To the first latch 1922 which finishes sending the video signals to the second latch 1923, subsequent video signals are sequentially written in accordance with timings signals from the shift register 1921. In this second round of the one line period, the video signals written into and held in the second latch 1923 are input to the pixel portion 1900.

Note that the signal line driver circuit 1920 may use another circuit which can output a signal of which pulse sequentially shifts, instead of the shift register 1921.

Note that the pixel portion 1900 is directly connected to the second latch 1923 in FIG. 19; however, the present invention is not limited to this configuration. A circuit which performs signal processing on the video signal output from the second latch 1923 can be provided at the stage prior to the pixel portion 1900. As examples of a circuit which performs signal processing, a buffer which can shape a waveform, a level shifter which can amplify the amplitude, a digital-to-analog converter circuit which can convert a digital signal into an analog signal, and the like are given.

Next, configurations of the first scan line driver circuit 1910A and the second scan line driver circuit 1910B will be described. The first scan line driver circuit 1910A includes a shift register 1911A, and the shift register 1911A includes an output circuit 1912A. The first threshold control circuit 1930A controls the first power supply control circuit 1931A so as to apply a forward bias voltage or a reverse bias voltage to the first scan line driver circuit 1910A.

The second scan line driver circuit 1910B includes a shift register 1911B, and the shift register 1911B includes an output circuit 1912B. The second threshold control circuit 1930B controls the second power supply control circuit 1931B so as to apply a forward bias voltage or a reverse bias voltage to the second scan line driver circuit 1910B.

The first scan line driver circuit 1910A and the second scan line driver circuit 1910B are controlled by the scan line drive control circuit 1932 such that one of the first scan line driver circuit 1910A and the second scan line driver circuit 1910B operates to drive the pixel portion 1900, and a reverse bias is added to the other of the first scan line driver circuit 1910A and the second scan line driver circuit 1910B. That is, in a given frame period, in the first scan line driver circuit 1910A, when a clock signal GCLK, a start pulse signal GSP, a scanning direction switching signal U/D, and a forward bias voltage are applied to the shift register 1911A, a selection signal of which pulse sequentially shifts is output from the output circuit 1912A. At the same time, in the second scan line driver circuit 1910B, a reverse bias voltage is applied from the second threshold control circuit 1930B and the second power supply control circuit 1931B, and a threshold voltage of a transistor in the output circuit 1912B is compensated. In another frame period, a reverse bias voltage is applied from the first threshold control circuit 1930A and the first power supply control circuit 1931A to the first scan line driver circuit 1910A, and a threshold voltage of a transistor in the output circuit 1912A is compensated. At the same time, the clock signal GCLK, the start pulse signal GSP, the scanning direction switching signal U/D, and the forward bias voltage are applied to the shift register 1911B in the second scan line driver circuit 1910B, and a selection signal of which pulse sequentially shifts is output from the output circuit 1912B.

Note that the order of the appearance of pulses of a selection signal at the first scan line driver circuit 1910A or the second scan line driver circuit 1910B is switched in accordance with the scanning direction switching signal U/D. When a pulse of a generated selection signal is input to a scan line, pixels of the scan line is selected, and a video signal is input to the pixels.

Note that, in FIG. 19, although the pixel portion 1900 is directly connected to the shift register 1911A or the shift register 1911B, the present invention is not limited to this configuration. A circuit which performs signal processing on a selection signal output from the shift register 1911A or the shift register 1911B may be provided in the stage prior to the pixel portion 1900. As examples of a circuit which performs signal processing, a buffer which can shape a waveform, a level shifter which can amplify the amplitude, and the like can be given.

In the case of an active matrix display device, gates of the transistors included in pixels for one line are connected to one scan line. Accordingly, in the case where the pixel portion 1900 is directly connected to the shift register 1911A or the shift register 1911B, it is preferable that transistors having current supply capability as high as transistors of pixels for one line can be turned on all at once be used in the output circuit 1912A or the output circuit 1912B.

Note that, although the pixel portion 1900, the first scan line driver circuit 1910A, the second scan line driver circuit 1910B, and the signal line driver circuit 1920 can be formed over the same substrate, any of them can be formed over a different substrate.

Figure 20B:
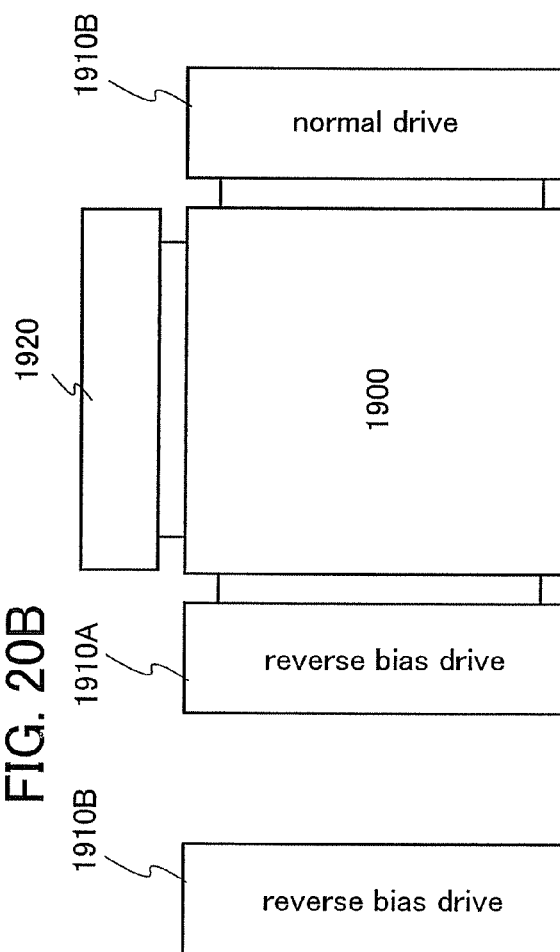
FIGS. 20A to 20D are diagrams illustrating the operation of a display device in accordance with an Embodiment Mode of the present invention.
Figure 20A:
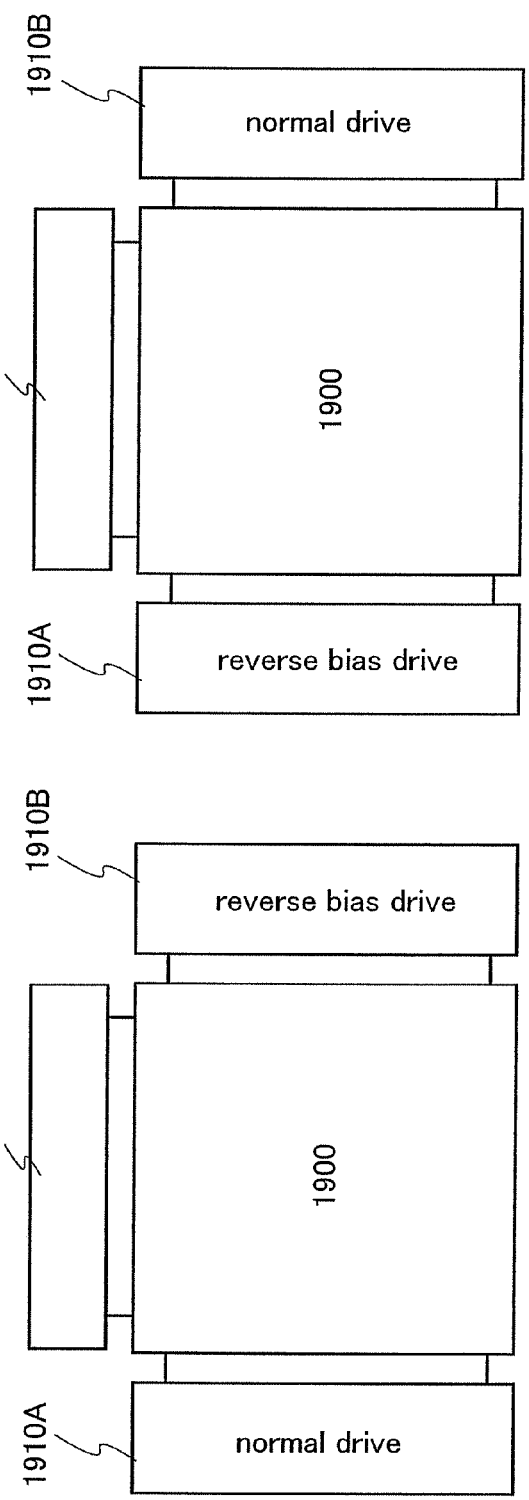

An example of a specific operation of the display device described in this embodiment mode will be described with reference to FIGS. 20A to 20D. As shown in FIGS. 20A and 20B, in the display device in this embodiment mode, one of the first scan line driver circuit 1910A and the second scan line driver circuit 1910B is driven with a forward bias voltage (hereinafter also referred to as normal drive), and the other thereof is driven with a reverse bias voltage (hereinafter also referred to as reverse bias drive). The scan line drive control circuit 1932 controls the first threshold control circuit 1930A and the first power supply control circuit 1931A or controls the second threshold control circuit 1930B and the second power supply control circuit 1931B, to apply a reverse bias to one of the first scan line driver circuit 1910A and the second scan line driver circuit 1910B which performs reverse bias drive, and the threshold voltage of the transistor in the output circuit 1912A or the output circuit 1912B is compensated. Note that, during the reverse bias drive, output of the output circuit 1912A or the output circuit 1912B is high impedance state. During the same period, while the threshold voltage of the transistor is compensated, the first scan line driver circuit 1910A or the second scan line driver circuit 1910B can perform normal drive so as to display an image on the pixel portion 1900, and the pixel portion 1900 can be driven.

Figure 20C:
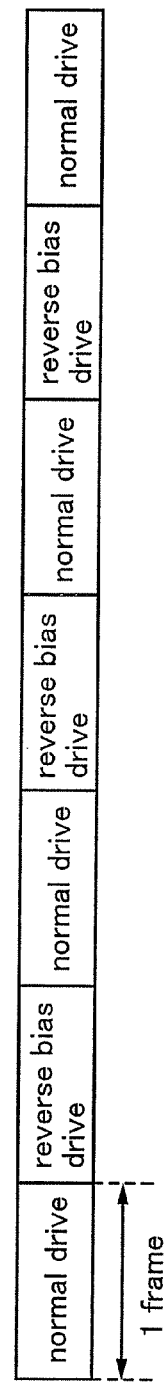
Figure 20D:
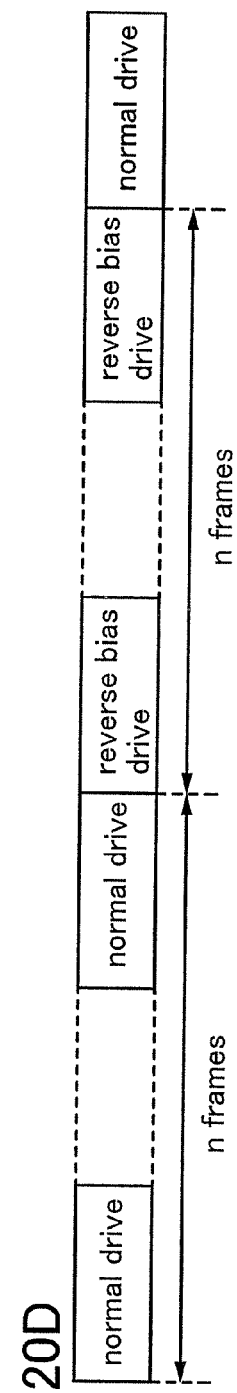

In FIG. 20A, the first scan line driver circuit 1910A is driven with forward bias, and the second scan line driver circuit 1910B is driven with reverse bias. In FIG. 20B, the first scan line driver circuit 1910A is driven with reverse bias, and the second scan line driver circuit 1910B is driven with forward bias. In FIGS. 20C and 20D, an example of a configuration in which operations shown in FIGS. 20A and 20B are alternately performed will be described. Note that, in FIGS. 20C and 20D, focus is put into the first scan line driver circuit 1910A, and the case where the first scan line driver circuit 1910A is driven with forward bias is referred to as normal drive and the case where the first scan line driver circuit 1910A is driven with reverse bias is referred to as reverse bias drive. That is, the second scan line driver circuit 1910B performs reverse bias drive in the case where the first scan line driver circuit 1910A is driven with forward bias, and the second scan line driver circuit 1910B performs normal drive in the case where the first scan line driver circuit 1910A is driven with reverse bias.

In FIG. 20C, the case where normal drive and reverse bias drive are alternately performed in the first scan line driver circuit 1910A per one frame period is shown. As described above, the display device in this embodiment mode can perform reverse bias drive while normal drive is performed. Therefore, the threshold voltage of the transistor can be compensated without suspension of display of an image on a pixel portion, and reliability of the display device can be increased.

In FIG. 20D, the case where normal drive and reverse bias drive are alternately performed in the first scan line driver circuit 1910A per n frame period (n is a natural number) is shown. In the display device described in this embodiment mode, unlike FIG. 20C, normal drive and reverse bias drive may be alternately performed per a plurality of frame periods, as shown in FIG. 20D. As described above, the display device in this embodiment mode can perform reverse bias drive while normal drive is performed. Therefore, the threshold voltage of the transistor can be compensated without suspension of display of an image on a pixel portion, and reliability of the display device can be increased.

Figure 21A:
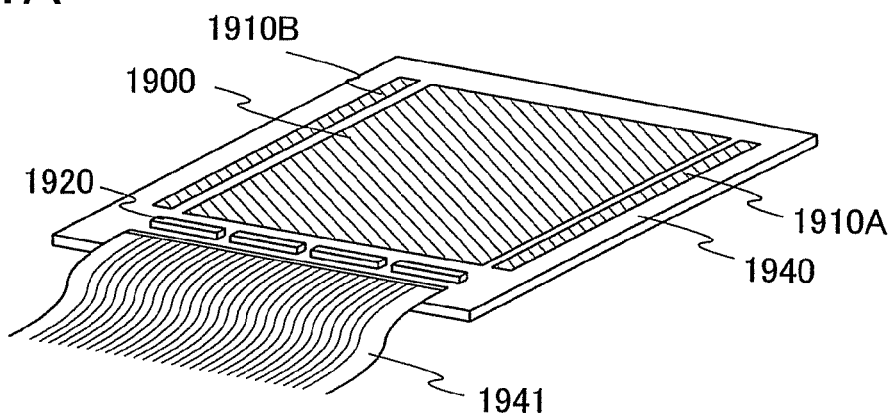

In FIG. 21A, one mode of a display device in which the signal line driver circuit 1920 formed separately is mounted on a substrate 1940 provided with the pixel portion 1900, the first scan line driver circuit 1910A, and the second scan line driver circuit 1910B is shown. Note that, in practice, another substrate is provided to sandwich the pixel portion 1900 between the substrate and the substrate 1940; however, a mode in which the substrate is not shown is illustrated in FIG. 21A to clarify the arrangement of the pixel portion 1900, the first scan line driver circuit 1910A, and the second scan line driver circuit 1910B.

A voltage of a power supply, various signals, and the like are supplied to the pixel portion 1900, the signal line driver circuit 1920, the first scan line driver circuit 1910A, and the second scan line driver circuit 1910B through an FPC 1941. The first threshold control circuit 1930A, the second threshold control circuit 1930B, the first power supply control circuit 1931A, the second power supply control circuit 1931B, and the scan line drive control circuit 1932 are electrically connected to the first scan line driver circuit 1910A and the second scan line driver circuit 1910B through the FPC 1941. In FIG. 21A, the signal line driver circuit 1920 may have a transistor using a single crystal semiconductor, a transistor using a polycrystalline semiconductor, or a transistor using an SOI.

Figure 21B:
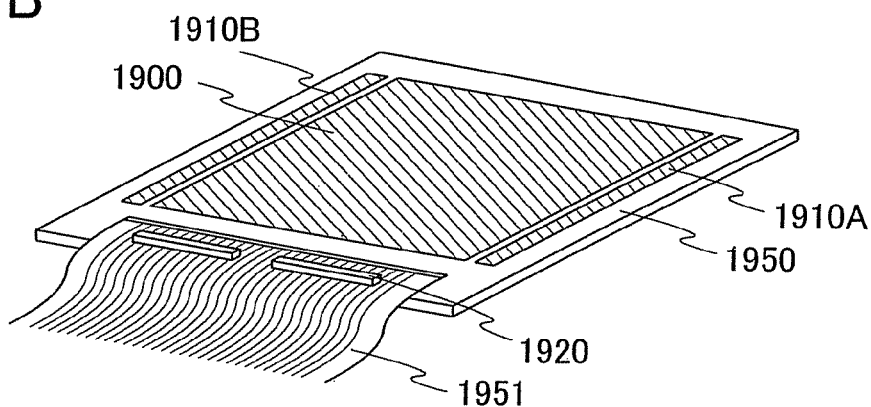

Note that when the signal line driver circuit 1920 is mounted, a substrate provided with the signal line driver circuit 1920 is not necessarily attached on a substrate provided with the pixel portion 1900, and for example, the substrate provided with the signal line driver circuit 1920 may be attached on the FPC. In FIG. 21B, one mode of a display device, in which the signal line driver circuit 1920 formed separately is mounted on a substrate 1950 provided with the pixel portion 1900, the first scan line driver circuit 1910A, and the second scan line driver circuit 1910B in such a way that the signal line driver circuit 1920 is attached on an FPC 1951, is shown. Note that, in practice, another substrate is provided to sandwich the pixel portion 1900 between the substrate and the substrate 1950; however, a mode in which the substrate is not shown is illustrated in FIG. 21B to clarify the arrangement of the pixel portion 1900, the first scan line driver circuit 1910A, the second scan line driver circuit 1910B, and the signal line driver circuit 1920. A voltage of a power supply, various signals, and the like are supplied to the pixel portion 1900, the signal line driver circuit 1920, the first scan line driver circuit 1910A, and the second scan line driver circuit 1910B through the FPC 1951. The first threshold control circuit 1930A, the second threshold control circuit 1930B, the first power supply control circuit 1931A, the second power supply control circuit 1931B, and the scan line drive control circuit 1932 are electrically connected to the first scan line driver circuit 1910A and the second scan line driver circuit 1910B through the FPC 1951. In FIG. 21B, the signal line driver circuit 1920 may have a transistor using a single crystal semiconductor, a transistor using a polycrystalline semiconductor, or a transistor using an SOI.

Figure 21C:
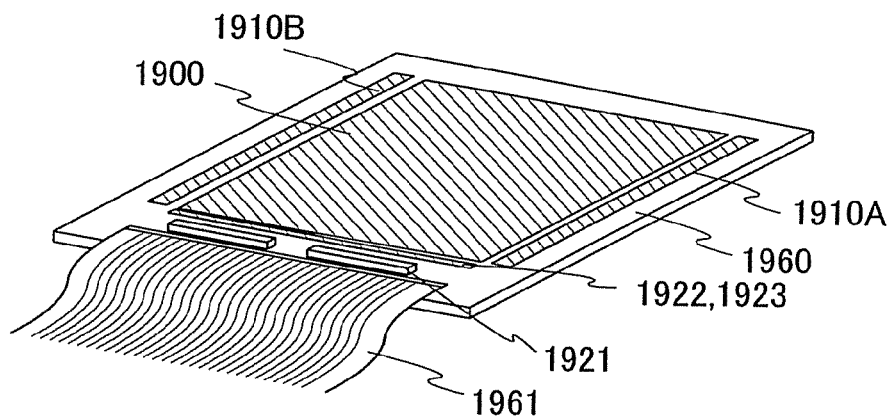

Alternatively, part of the signal line driver circuit may be formed over the same substrate as the pixel portion 1900, the first scan line driver circuit 1910A, and the second scan line driver circuit 1910B, and the other thereof may be separately formed and mounted. One mode of a display device, in which the shift register 1921 of the signal line driver circuit 1920 which is formed separately is mounted on a substrate 1960 provided with the first latch 1922 and the second latch 1923 included in the signal line driver circuit 1920 in addition to the pixel portion 1900, the first scan line driver circuit 1910A, and the second scan line driver circuit 1910B, is shown in FIG. 21C. Note that, in practice, another substrate is provided to sandwich the pixel portion 1900 between the substrate and the substrate 1960; however, a mode in which the substrate is not shown is illustrated in FIG. 21C to clarify the arrangement of the pixel portion 1900, the first scan line driver circuit 1910A, the second scan line driver circuit 1910B, and the signal line driver circuit 1920. A voltage of a power supply, various signals, and the like are supplied to the pixel portion 1900, the signal line driver circuit 1920, the first scan line driver circuit 1910A, and the second scan line driver circuit 1910B through an FPC 1961. The first threshold control circuit 1930A, the second threshold control circuit 1930B, the first power supply control circuit 1931A, the second power supply control circuit 1931B, and the scan line drive control circuit 1932 are electrically connected to the first scan line driver circuit 1910A and the second scan line driver circuit 1910B through the FPC 1961. In FIG. 21C, the signal line driver circuit 1920 may have a transistor using a single crystal semiconductor, a transistor using a polycrystalline semiconductor, or a transistor using an SOI.

Note that there is no particular limitation on a connection method of the substrate formed separately, and a known COG method, wire bonding method, TAB method, or the like can be used. Also, a position for connection is not limited to the position shown in FIGS. 21A to 21C as long as electrical connection is possible. Alternatively, a controller, a CPU, a memory, and/or the like may be formed separately to be connected.

By separately forming an integrated circuit such as a driver circuit and mounting on a substrate, yield can be improved and optimization of a process according to characteristics of each circuit can be easily performed, as compared with a case of forming all circuits over a same substrate as a pixel portion.

Note that as the display device of the present invention, an active matrix display device such as a liquid crystal display device, a light-emitting device provided with a light-emitting element typified by an organic light-emitting diode (OLED) in each pixel, a DMD (digital micromirror device), a PDP (plasma display panel), or an FED (field emission display) is included in its category. In addition, a passive matrix display device is included in its category.

This embodiment mode can be combined with the above embodiment modes, as appropriate.

[Embodiment 1]

In this embodiment, a more specific configuration of the signal line driver circuit included in the display device of the present invention will be described.

Figure 10:
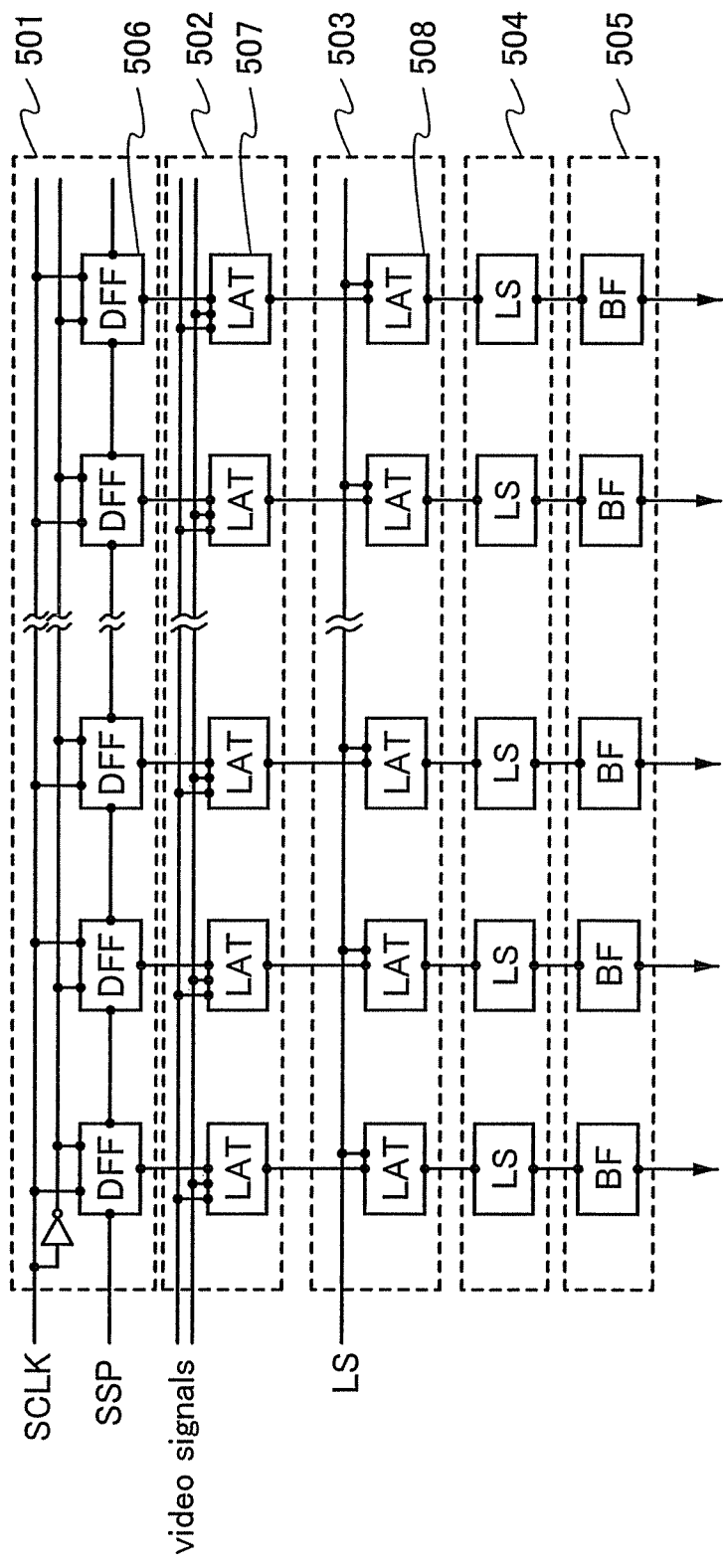
FIG. 10 is a block diagram showing a configuration of a signal line driver circuit.

In FIG. 10, an example of a circuit diagram of a signal line driver circuit is shown. The signal line driver circuit shown in FIG. 10 includes a shift register 501, a first latch 502, a second latch 503, a level shifter 504, and a buffer 505.

The shift register 501 includes a plurality of delay flip-flops (DFFs) 506. The shift register 501 generates a timing signal of which pulse sequentially shifts and inputs the timing signal to the first latch 502 which is the next stage in accordance with a start pulse SSP and a clock signal SCLK which are input.

The first latch 502 includes a plurality of memory circuits (LATs) 507. The first latch 502 sequentially samples video signals and writes data of the sampled video signals to the memory circuits 507 in accordance with the pulse of the timing signal which is input.

The second latch 503 includes a plurality of memory circuits (LATs) 508. It is preferable that the number of the memory circuits 508 be the same or more than the number of pixels for one line in a pixel portion.

The data of the video signal written into the memory circuits 507 in the first latch 502 are written into and held in the memory circuits 508 included in the second latch 503, in accordance with a pulse of a latch signal LS which is input to the second latch 503. The data held in the memory circuits 508 are output to the level shifter 504 which is the next stage, as video signals.

The level shifter 504 controls the amplitude of voltage of the video signals which are input and outputs the video signals to the buffer 505 which is the next stage. The video signals which are input are output to signal lines after waveforms of the video signals which are input are shaped in the buffer 505.

This embodiment can be combined with the above embodiment modes, as appropriate.

[Embodiment 2]

In this embodiment, a configuration of a pixel portion included in an active matrix light-emitting device which is a kind of a display device of the present invention will be described.

An active matrix light-emitting device includes a light-emitting element which corresponds to a display element in each pixel. Since a light-emitting element emits light by itself, the light-emitting element has high visibility, dose not need a backlight which is necessary for a liquid crystal display device, is suitable for reduction in thickness, and does not have limitations on the viewing angle. Although a light-emitting device using an organic light-emitting diode (OLED) which is a kind of a light-emitting element is described in this embodiment, the present invention may be a light-emitting device using another light-emitting element.

An OLED includes a layer (hereinafter referred to as an electroluminescent layer) including a material in which luminescence (electroluminescence) generated by application of an electric field can be obtained, an anode layer, and a cathode layer. As electroluminescence, there are luminescence (fluorescence) at the time of returning to a ground state from a singlet-excited state and luminescence (phosphorescence) at the time of returning to a ground state from a triplet-excited state. A light-emitting device of the present invention may use either one of fluorescence and phosphorescence or both fluorescence and phosphorescence.

Figure 11A:
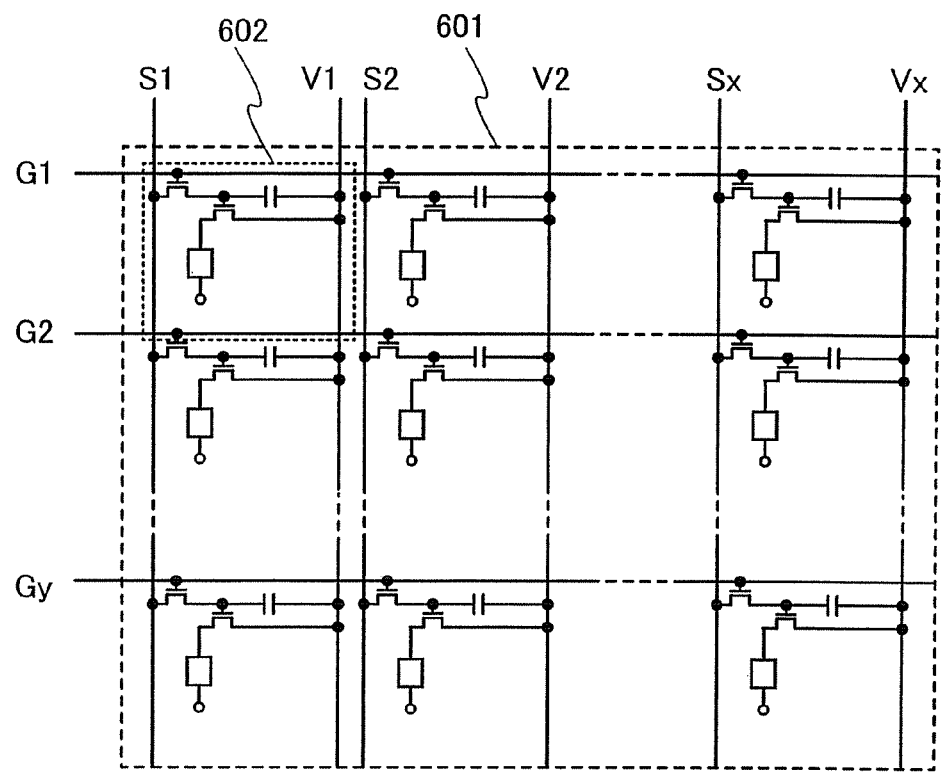
FIGS. 11A and 11B are diagrams showing a configuration of a pixel portion.

FIG. 11A is an enlarged view of a pixel portion 601 of a light-emitting device of this embodiment. The pixel portion 601 includes a plurality of pixels 602 arranged in matrix. Reference signs S1 to Sx denote signals lines; reference signs V1 to Vx denote power supply lines; and reference signs G1 to Gy denote scan lines. In this embodiment, the pixel 602 includes one of the signal lines S1 to Sx, one of the power supply lines V1 to Vx, and one of the scan lines G1 to Gy.

Figure 11B:
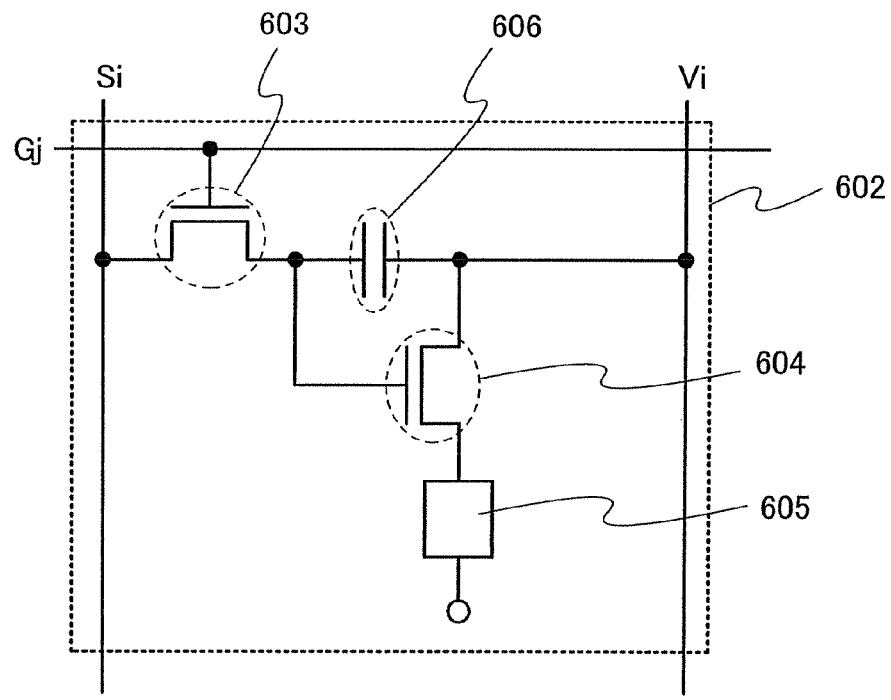

FIG. 11B is an enlarged view of the pixel 602. In FIG. 11B, a reference numeral 603 denotes a switching transistor. A gate of the switching transistor 603 is connected to the scan line Gj (j=one of 1 to y). One of a source and a drain of the switching transistor 603 is connected to the signal line Si (i=one of 1 to x). The other of the source and the drain of the switching transistor 603 is connected to a gate of a driving transistor 604. In addition, a storage capacitor 606 is provided between the power supply line Vi (i=one of 1 to x) and the gate of the driving transistor 604.

The storage capacitor 606 is provided to hold a gate voltage (a voltage between the gate and a source) of the driving transistor 604 when the switching transistor 603 is off. Note that, although the configuration in which the storage capacitor 606 is provided is described in this embodiment, the present invention is not limited to this configuration and the storage capacitor 606 is not necessarily provided.

One of the source and a drain of the driving transistor 604 is connected to the power supply line Vi (i=one of 1 to x). The other of the source and the drain of the driving transistor 604 is connected to a light-emitting element 605. The light-emitting element 605 includes an anode, a cathode, and an electroluminescent layer provided between the anode and the cathode. When the anode is connected to the source or the drain of the driving transistor 604, the anode corresponds to a pixel electrode and the cathode corresponds to a counter electrode. Alternatively, when the cathode is connected to the source or the drain of the driving transistor 604, the cathode corresponds to the pixel electrode and the anode corresponds to the counter electrode.

Predetermined voltages are applied to each of the counter electrode of the light-emitting element 605 and the power supply line Vi.

The scan line Gj is selected in accordance with pulses of selection signals input to the scan lines G1 to Gy from a scan line driver circuit. That is, when the pixel 602 of a line corresponding to the scan line Gj is selected, the switching transistor 603, the gate of which is connected to the scan line Gj, in the pixel 602 of the line is turned on. Then, when a video signal is input to the signal line Si, the gate voltage of the driving transistor 604 is determined in accordance with a voltage of the video signal. When the driving transistor 604 is turned on, the power supply line Vi and the light-emitting element 605 are electrically connected, so that the light-emitting element 605 emits light by the supply of current. Alternatively, when the driving transistor 604 is turned off, the power supply line Vi and the light-emitting element 605 are not electrically connected, so that the supply of current to the light-emitting element 605 is not performed and the light-emitting element 605 does not emit light.

Note that the switching transistor 603 and the driving transistor 604 can be either n-channel transistors or p-channel transistors. Note that when the source or the drain of the driving transistor 604 is connected to the anode of the light-emitting element 605, the driving transistor 604 is preferably a p-channel transistor. Alternatively, when the source or the drain of the driving transistor 604 is connected to the cathode of the light-emitting element 605, the driving transistor 604 is preferably an n-channel transistor.

Each of the switching transistor 603 and the driving transistor 604 may have a multi-gate structure such as a double-gate structure or a triple-gate structure instead of a single-gate structure.

Note that the present invention can be applied to not only a display device including pixels having the circuit configuration shown in FIGS. 11A and 11B but also a display device including pixels having various circuit configurations. The pixel included in the display device of the present invention may have a threshold voltage compensation circuit configuration in which the threshold voltage of the driving transistor can be compensated, a current input circuit configuration in which the threshold voltage and mobility of the driving transistor can be compensated by the input of current, or the like, for example.

This embodiment can be combined with the above embodiment modes and the above embodiment, as appropriate.

[Embodiment 3]

In this embodiment, a configuration of a pixel portion included in an active matrix liquid crystal display device which is a kind of a display device of the present invention will be described.

Figure 12:
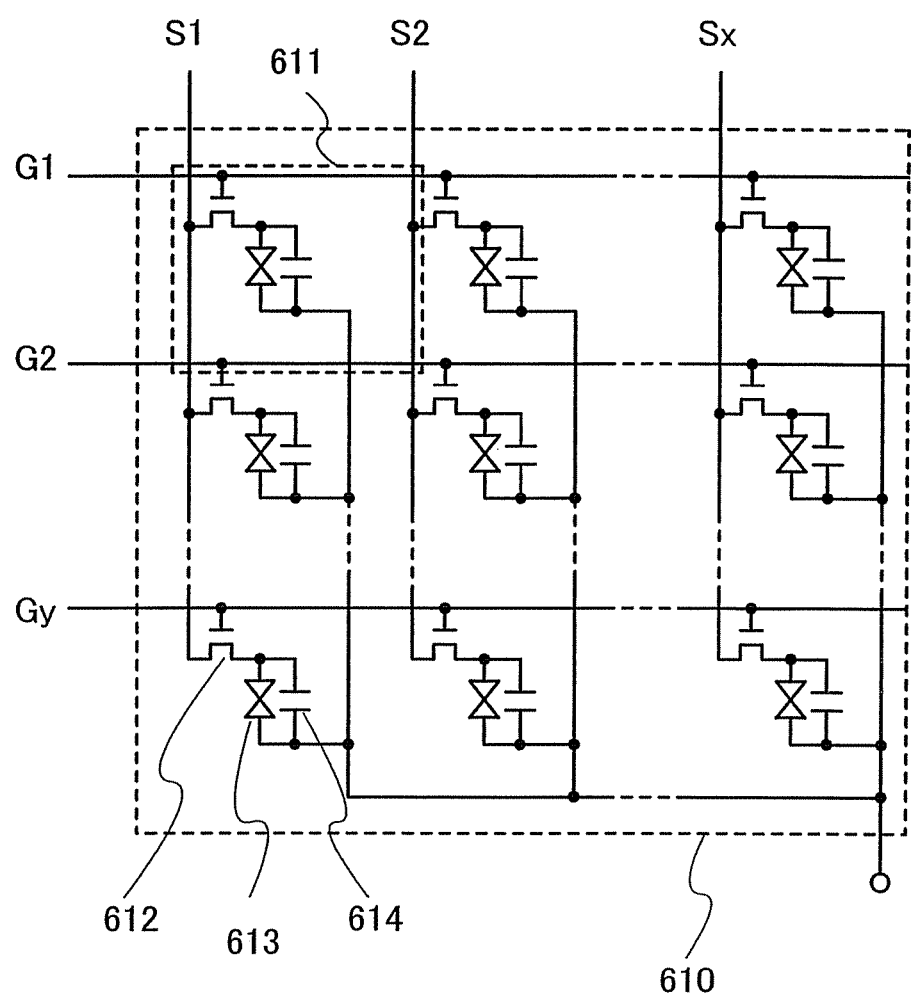
FIG. 12 is a diagram showing a configuration of a pixel portion.

FIG. 12 is an enlarged view of a pixel portion 610 of a display device of this embodiment. In FIG. 12, the pixel portion 610 includes a plurality of pixels 611 arranged in matrix. Reference signs S1 to Sx denote signals lines, and reference signs G1 to Gy denote scan lines. In this embodiment, the pixel 611 includes one of the signal lines S1 to Sx and one of the scan lines G1 to Gy.

The pixel 611 includes a transistor 612 functioning as a switching element, a liquid crystal cell 613 corresponding to a display element, and a storage capacitor 614. The liquid crystal cell 613 includes a pixel electrode, a counter electrode, and liquid crystals which are sandwiched between the pixel electrode and the counter electrode. A gate electrode of the transistor 612 is connected to the scan line Gj (j=one of 1 to x). One of a source and a drain of the transistor 612 is connected to the signal line Si (i=one of 1 to x). The other of the source and the drain of the transistor 612 is connected to the pixel electrode of the liquid crystal cell 613. In addition, one of two electrodes of the storage capacitor 614 is connected to the pixel electrode of the liquid crystal cell 613. The other of the two electrodes of the storage capacitor 614 is connected to a common electrode. The common electrode may be connected to either the counter electrode of the liquid crystal cell 613 or another scan line.

The scan line Gj is selected in accordance with pulses of selection signals input to the scan lines G1 to Gy from a scan line driver circuit. That is, when the pixel 611 of a line corresponding to the scan line Gj is selected, the transistor 612, the gate of which is connected to the scan line Gj, in the pixel 611 of the line is turned on. Then, when a video signal is input to the signal line Si from a signal line driver circuit, a voltage is applied between the pixel electrode and the counter electrode of the liquid crystal cell 613 in accordance with the voltage of the video signal. Transmissivity of the liquid crystal cell 613 is determined in accordance with a level of the voltage applied between the pixel electrode and the counter electrode. In addition, the voltage between the pixel electrode and the counter electrode of the liquid crystal cell 613 is held in the storage capacitor 614.

This embodiment can be combined with the above embodiment modes and the above embodiments, as appropriate.

[Embodiment 4]

Next, a specific method for manufacturing the display device of the present invention will be described. Note that, in this embodiment, an example of a light-emitting device having a transistor will be described.

First, as shown in FIG. 13A, after a conductive film is formed over a substrate 700, the conductive film is processed (pattered) into a given shape so that a conductive film 701 and a conductive film 702 are formed. As the substrate 700, a glass substrate such as barium borosilicate glass or aluminoborosilicate glass, a quartz substrate, a ceramic substrate, or the like can be used. Alternatively, a metal substrate including a stainless steel substrate or a semiconductor substrate such as a silicon substrate may be used. A substrate formed of a synthetic resin which has flexibility, such as plastic, generally tends to have lower allowable temperature limit than the above substrates; however, the substrate can be used as long as it can resist a processing temperature in a manufacturing process.

As a plastic substrate, polyester typified by polyethylene terephthalate (PET); polyether sulfone (PES); polyethylene naphthalate (PEN); polycarbonate (PC); polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; or the like can be used.

The conductive films 701 and 702 can be formed of tantalum (Ta), tungsten (W), titanium (Ti), molybdenum (Mo), aluminum (Al), copper (Cu), chromium (Cr), niobium (Nb), or the like; an alloy containing any of the above metals as its main component; or a compound containing any of the above metals. Alternatively, the conductive films 701 and 702 may be formed of a semiconductor such as polycrystalline silicon, in which a semiconductor film is doped with an impurity element such as phosphorus which imparts conductivity.

In this embodiment, the conductive films 701 and 702 are formed of one conductive film; however, this embodiment is not limited to this structure. The conductive films 701 and 702 may be formed of stacked two or more conductive films. In the case of a three-layer structure in which three or more conductive films are stacked, a stacked-layer structure of a molybdenum film, an aluminum film, and a molybdenum film may be employed. The conductive films can be formed by a CVD method, a sputtering method, or the like.

Next, a gate insulating film 703 is formed so as to cover the conductive films 701 and 702. The gate insulating film 703 can be formed of a single layer or a stack of a film containing silicon oxide, silicon nitride (e.g., $SiN_x$ or $Si_3N_4$,), silicon oxynitride ($SiO_xN_y$, where x>y>0), silicon nitride oxide ($SiN_xO_y$, where x>y>0), or the like by a plasma CVD method, a sputtering method, or the like. In the case of using a stack, it is preferable to use a three-layer structure of a silicon oxide film, a silicon nitride film, and a silicon oxide film stacked in this order from the conductive films 701 and 702 side, for example.

Next, a first semiconductor film 704 is formed over the gate insulating film 703. The thickness of the first semiconductor film 704 is 20 nm to 200 nm (desirably, 40 nm to 170 nm, preferably, 50 nm to 150 nm). Note that the first semiconductor film 704 may be an amorphous semiconductor or a polycrystalline semiconductor. Not only silicon but also silicon germanium can be used for the semiconductor. In the case of using silicon germanium, it is preferable that a concentration of germanium be approximately 0.01 at. % to 4.5 at. %.

Note that the first semiconductor film 704 may be crystallized by a known technique. As the known crystallization method, a laser crystallization method which uses a laser beam or a crystallization method which uses a catalytic element may be used. Alternatively, a crystallization method which uses a catalytic element and a laser crystallization method may be used in combination. In the case of using a substrate superior in heat resistance, such as a quartz substrate, as the substrate 700, a crystallization method combining a thermal crystallization method which uses an electrically-heated furnace, a lump anneal crystallization method which uses infrared light, a crystallization method which uses a catalytic element, or high-temperature annealing at approximately 950° C. may be used.

For example, in the case of using laser crystallization, heat treatment at 550° C. for four hours is performed on the first semiconductor film 704 before laser crystallization in order to improve resistance of the first semiconductor film 704 with respect to laser. By using a solid-state laser capable of continuous oscillation and irradiating the first semiconductor film 704 with a laser beam of a second to fourth harmonic thereof, large grain crystals can be obtained. Typically, a second harmonic (532 nm) or a third harmonic (355 nm) of an Nd:$YVO_4$ laser (fundamental wave is 1064 nm) is desirably used, for example. Specifically, a laser beam emitted from a continuous-wave $YVO_4$ laser is converted into a harmonic by using a non-linear optical element, whereby a laser beam, the output of which is 10 W, is obtained. Then, the laser beam is preferably shaped into a rectangular or elliptical shape on an irradiation surface by an optical system, for the irradiation of the first semiconductor film 704. The energy density at this time needs to be approximately 0.01 MW/$cm^2$ to 100 MW/$cm^2$ (preferably, 0.1 MW/$cm^2$ to 10 MW/$cm^2$). In addition, the scan rate is set at approximately 10 cm/sec to 2000 cm/sec.

As a continuous-wave gas laser, an Ar laser, a Kr laser, or the like can be used. Further, as a continuous-wave solid-state laser, a YAG laser, a $YVO_4$ laser, a YLF laser, a $YAlO_3$ laser, a forsterite ($Mg_2SiO_4$) laser, a $GdVO_4$ laser, a $Y_2O_3$ laser, a glass laser, a ruby laser, an alexandrite laser, a Ti:sapphire laser, or the like can be used.

As a pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper-vapor laser, or a gold-vapor laser can be used.

The laser crystallization may be performed by a pulsed laser beam at a repetition rate of greater than or equal to 10 MHz, which is a considerably higher frequency band than a usually used frequency band of several ten to several hundred Hz. It is said that it takes several tens to several hundreds of nanoseconds to solidify the first semiconductor film 704 completely after the first semiconductor film 704 is irradiated with a pulsed laser beam. Therefore, by using the above frequency band, the first semiconductor film 704 can be irradiated with a laser beam of the next pulse until the first semiconductor film 704 is solidified after being melted by a laser beam of the preceding pulse. Therefore, since a solid-liquid interface can be continuously moved in the first semiconductor film 704, the first semiconductor film 704 which has crystal grains that have grown continuously in a scanning direction is formed. Specifically, an aggregate of contained crystal grains which have widths of 10 μm to 30 μm in the scanning direction and widths of approximately 1 μm to 5 μm in the direction perpendicular to the scanning direction can be formed. By forming single crystal grains which grow continuously along the scanning direction, the first semiconductor film 704 which has almost no crystal boundary at least in a channel direction of a transistor can be formed.

Note that the laser crystallization may be performed by irradiation with a continuous-wave laser beam of a fundamental wave and a continuous-wave laser beam of a harmonic in parallel or by irradiation with a continuous-wave laser beam of a fundamental wave and a pulsed laser beam of a harmonic in parallel.

Note that laser beam irradiation may be performed in an inert gas atmosphere of a noble gas, nitrogen, or the like. Accordingly, roughness of a semiconductor surface due to laser beam irradiation can be prevented, and variation of a threshold voltage due to variation of an interface state density can be suppressed.

By irradiation with the above laser beam, the first semiconductor film 704 with higher crystallinity can be formed. Note that a polycrystalline semiconductor formed by a sputtering method, a plasma CVD method, a thermal CVD method, or the like may be used for the first semiconductor film 704.

The first semiconductor film 704 is crystallized in this embodiment; however, an amorphous silicon film or a microcrystalline semiconductor film may be directly subjected to a process described below without being crystallized. A transistor which uses an amorphous semiconductor or a microcrystalline semiconductor has advantages of lower cost and higher yield because it needs fewer manufacturing processes than a transistor which uses a polycrystalline semiconductor.

An amorphous semiconductor can be obtained by glow discharge decomposition of a gas containing silicon. As the gas containing silicon, $SiH_4$ and $Si_2H_6$ are given. The gas containing silicon diluted with hydrogen or hydrogen and helium may be used.

Next, a second semiconductor film 705 and a third semiconductor film 706 are sequentially formed over the first semiconductor film 704. The second semiconductor film 705 is formed without intentionally adding an impurity element for controlling valence electrons. The second semiconductor film 705 has one conductivity type and is formed between the first semiconductor film 704 and the third semiconductor film 706 which is used for forming a source region functioning as a source and a drain region functioning as a drain so that the second semiconductor film 705 has a function like a buffer layer (shock-absorbing layer). Therefore, the second semiconductor film 705 is not necessarily provided in the case of forming the third semiconductor film 706 having the same conductivity type as the first semiconductor film 704 having weak n-type conductivity. In the case where an impurity element which imparts p-type conductivity is added for controlling a threshold voltage, the second semiconductor film 705 has an effect of changing impurity concentration step by step and becomes a preferred mode for forming a good junction. That is, a transistor to be formed can have a function as a low concentration impurity region (an LDD region) formed between a channel forming region and a source region or a drain region.

In the case where an n-channel transistor is formed of the third semiconductor film 706 having one conductivity type, phosphorus may be added to the third semiconductor film 706 as a typical impurity element, and an impurity gas such as $PH_3$ may be added to the gas containing silicon. The second semiconductor film 705 and the third semiconductor film 706 may be an amorphous semiconductor or a polycrystalline semiconductor, like the first semiconductor film 704. In addition, as a semiconductor, silicon germanium as well as silicon can be used.

As described above, from the gate insulating film 703 to the third semiconductor film 706 having one conductivity type can be formed in succession without exposing to the atmosphere. That is, since each interface of the stack can be formed without being polluted by an atmospheric component or by a contamination impurity element floating in the atmosphere, variation of characteristics of a transistor can be reduced.

Next, as shown in FIG. 13B, a mask 707 is formed, and the first semiconductor film 704, the second semiconductor film 705, and the third semiconductor film 706 having one conductivity type are processed (patterned) into a desired shape to be separated into island shapes.

Next, as shown in FIG. 13C, after the mask 707 is removed, a second conductive film 708 is formed. Although the second conductive film 708 is formed of aluminum or a conductive material containing aluminum as its main component, a layer on a side which is in contact with the semiconductor film may have a stacked-layer structure using titanium, tantalum, molybdenum, tungsten, copper, or nitride of the element. For example, the following combination can be considered: the first layer is formed of Ta and the second layer is formed of W; the first layer is formed of tantalum nitride and the second layer is formed of Al; the first layer is formed of titanium nitride and the second layer is formed of copper; and the first layer is formed of titanium, the second layer is formed of aluminum, and the third layer is formed of titanium. An AgPdCu alloy may be used for one of the first layer and the second layer. A three-layer structure in which tungsten, an alloy of aluminum and silicon (Al—Si), and tantalum nitride are sequentially stacked may be used. Instead of tungsten, tungsten nitride may be used. Instead of an alloy of aluminum and silicon (Al—Si), an alloy film of aluminum and titanium (Al—Ti) may be used. Instead of tantalum nitride, titanium may be used. To improve heat resistance of aluminum, 0.5 at. % to 5 at. % of an element such as titanium, silicon, scandium, neodymium, or copper may be added to aluminum.

Figure 14A:
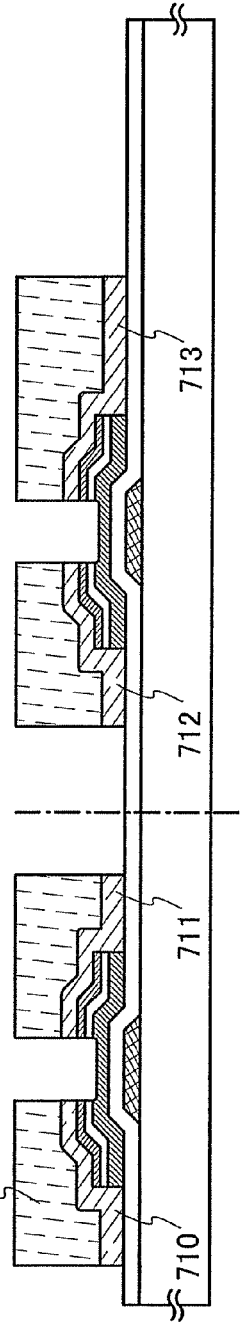
FIGS. 14A to 14C are diagrams showing a method for manufacturing a display device in accordance with an Embodiment of the present invention.

Next, as shown in FIG. 14A, a mask 709 is formed. The mask 709 is a mask which is used for forming a wiring to be connected to a source region or a drain region when the second conductive film 708 is patterned, and at the same time, the mask 709 is used as an etching mask which is used for forming a channel formation region by removing the third semiconductor film 706 having one conductivity type. Etching of the conductive film of aluminum or the conductive film which contains aluminum as its main component may be performed using a chloride gas such as $BCl_3$ or $Cl_2$. Wirings 710 to 713 are formed from the second conductive film 708 by this etching processing. In addition, although etching to form a channel formation region is performed using a fluoride gas such as $SF_6$, $NF_3$, or $CF_4$, etching selectivity to the first semiconductor film 704 which serves as a base cannot be obtained in this case; therefore, processing time is adjusted as appropriate. As described above, a structure of a channel etch-type transistor can be formed.

Figure 14B:
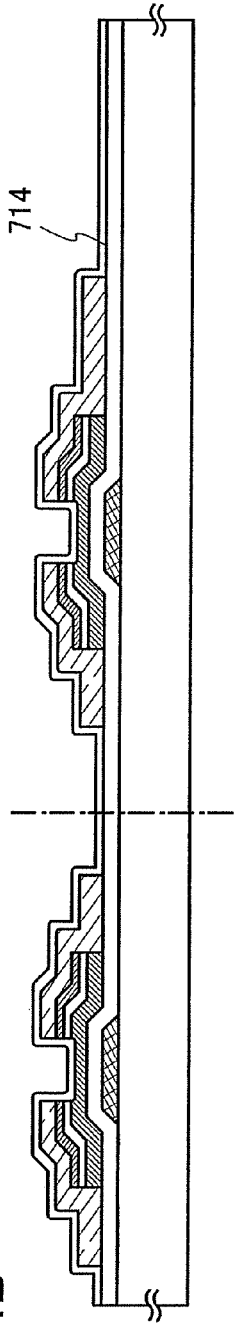

Next, after the mask 709 is removed, as shown in FIG. 14B, an insulating film 714 for protection of the channel formation region is formed of a silicon nitride film. This silicon nitride film can be formed by a sputtering method or a glow discharge decomposition method; however, this silicon nitride film is provided to prevent an entry of a contamination impurity such as an organic matter, a metal, or moisture floating in the atmosphere and is required to be a dense film. A denser silicon nitride film can be formed by radio frequency sputtering by using silicon as a target and using a sputtering gas in which nitrogen and a noble gas element such as argon are mixed.

Figure 14C:
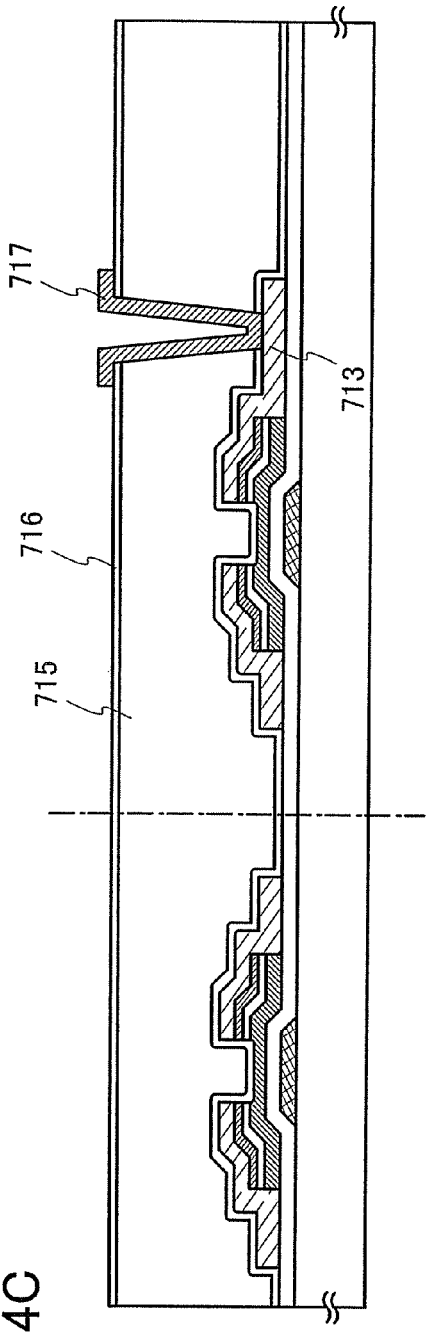

Next, as shown in FIG. 14C, an insulating film 715 for planarization is formed over the insulating film 714. The insulating film 715 is preferably formed of an insulating film containing an organic resin such as acrylic, polyimide, or polyamide; or a siloxane resin. A siloxane resin corresponds to a resin including a Si—O—Si bond formed using a siloxane-based material as a starting material. A siloxane resin may have at least one kind of fluorine, a fluoro group, and an organic group (e.g., an alkyl group or an aromatic hydrocarbon) as well as hydrogen, as a substituent. These materials have water absorbing properties. Thus, it is preferable that an insulating film 716 for preventing the entry and release of moisture be formed over the insulating film 715. The above-described silicon nitride film may be adopted for the insulating film 716.

Next, the insulating film 714, the insulating film 715, and the insulating film 716 are patterned, whereby an opening to expose part of the wiring 713 is formed. In the opening, a wiring 717 which comes into contact with the wiring 713 is formed.

Figure 15A:
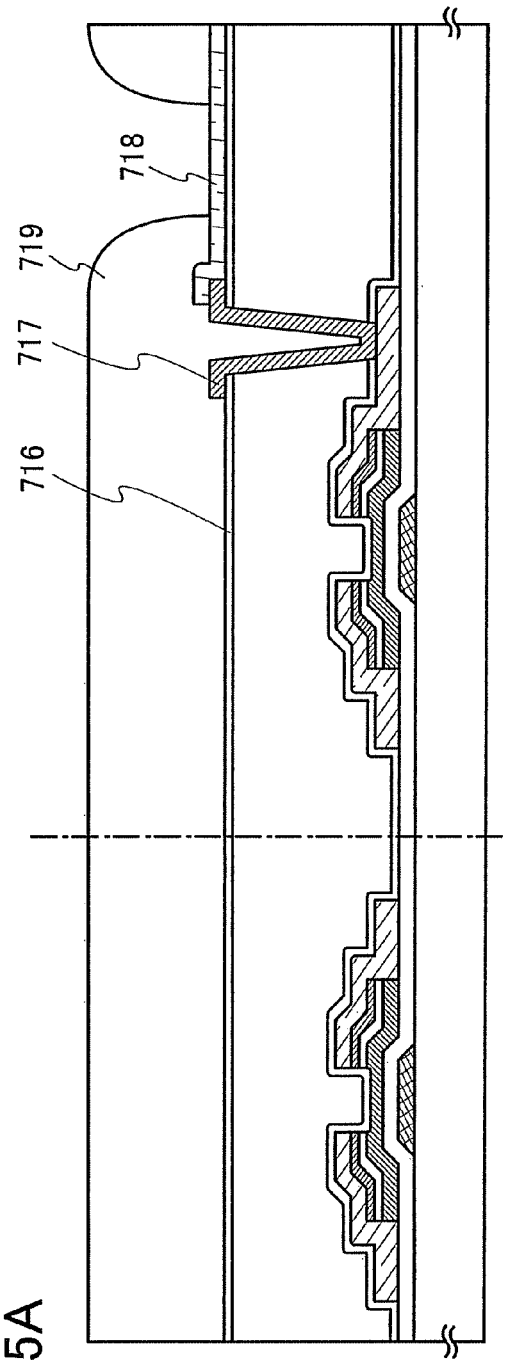
FIGS. 15A and 15B are diagrams showing a method for manufacturing a display device in accordance with an Embodiment of the present invention.

Next, as shown in FIG. 15A, an anode 718 is formed over the insulating film 716 so as to be in contact with the wiring 717. In this embodiment, a conductive film is formed of indium tin oxide (ITSO) containing silicon oxide by a sputtering method, and the conductive film is patterned so that the anode 718 is formed. Note that, a light-transmitting oxide conductive material such as indium tin oxide (ITO), zinc oxide (ZnO), indium zinc oxide (IZO), or zinc oxide (GZO) doped with gallium, as well as ITSO may be used for the anode 718.

In the case where ITSO is used, ITO containing 2 wt. % to 10 wt. % of silicon oxide can be used as a target. Specifically, in this embodiment, by using a target containing $In_2O_3$, $SnO_2$, and $SiO_2$ in a weight percent ratio of 85:10:5, a conductive film which is to serve as the anode 718 is formed with a thickness of 105 nm, with a flow rate of Ar at 50 sccm, with a flow rate of $O_2$ at 3 sccm, with a sputtering pressure of 0.4 Pa, with a sputtering power of 1 kW, and with a deposition rate of 30 nm/min.

After the conductive film is formed, the conductive film may be polished by a CMP method, by cleaning up with a polyvinyl alcohol-based porous body, or the like so that a surface of the conductive film is planarized before patterning.

Next, a bank 719 having an opening is formed over the insulating layer 716 so as to cover the wiring 717 and part of the anode 718. Part of the anode is exposed at the opening of the bank 719. The bank 719 is formed from an organic resin film, an inorganic insulating film, or a siloxane-based insulating film. For example, acrylic, polyimide, polyamide, or the like can be used as the organic resin film, and silicon oxide, silicon nitride oxide, or the like can be used as the inorganic insulating film. A mask used for forming the opening can be formed by a droplet discharging method, a printing method, and the like. Meanwhile, the bank 719 itself can be formed by a droplet discharging method, a printing method, and the like.

Next, in the present invention, before an electroluminescent layer 720 is formed, heat treatment under an atmosphere or heat treatment (vacuum bake) under a vacuum atmosphere is performed to remove moisture, oxygen, or the like adsorbed in a bank 719 and the anode 718. Specifically, heat treatment is performed under a vacuum atmosphere with a temperature of a substrate at 200° C. to 450° C., and preferably, at 250° C. to 300° C., for approximately 0.5 to 20 hours. It is preferable to perform under $4\times10^{-5}$ Pa or less, and it is most preferable to perform under $4\times10^{-6}$ Pa or less if possible. In the case where the electroluminescent layer 720 is formed after heat treatment is performed under a vacuum atmosphere, the substrate is placed under a vacuum atmosphere just before the electroluminescent layer 720 is formed, whereby reliability can be further increased. The anode 718 may be irradiated with ultraviolet rays before or after vacuum baking.

Figure 15B:
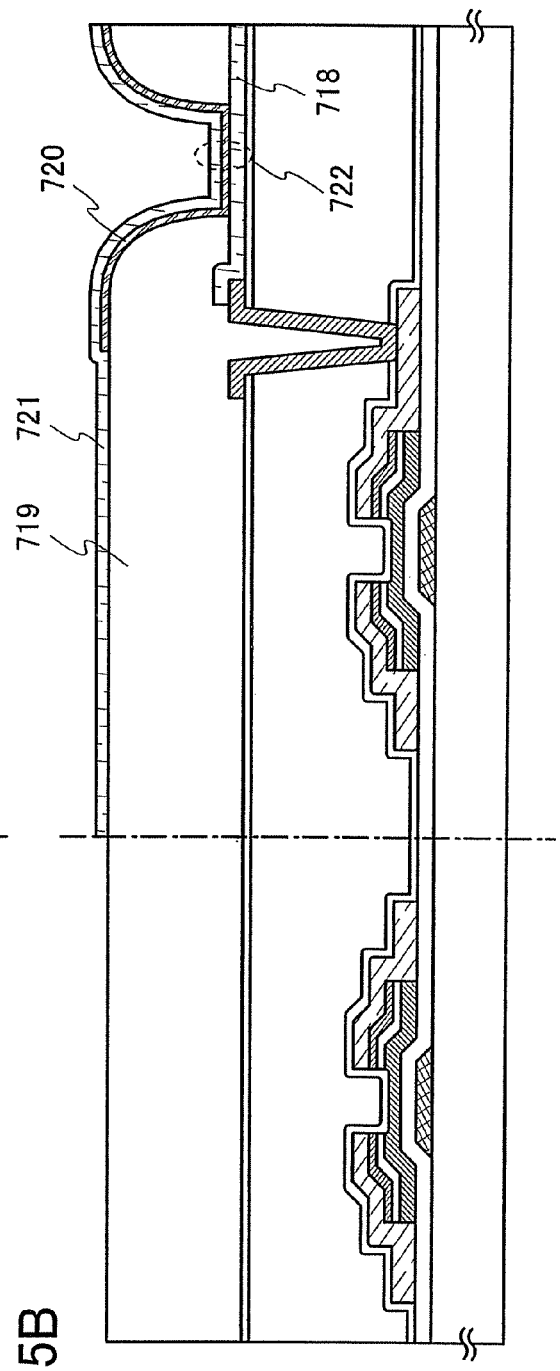

Next, as shown in FIG. 15B, the electroluminescent layer 720 is formed over the anode 718. The electroluminescent layer 720 may be formed of a single layer or a plurality of layers and each layer may contain an inorganic material as well as an organic material. Luminescence of the electroluminescent layer 720 includes luminescence (fluorescence) at the time of returning to a ground state from a singlet-excited state and luminescence (phosphorescence) at the time of returning to a ground state from a triplet-excited state.

Next, a cathode 721 is formed to cover the electroluminescent layer 720. The cathode 721 can be formed using a metal, an alloy, an electric conductive compound, or a mixture of these each of which generally has a low work function. Specifically, a rare-earth metal such as Yb or Er as well as an alkali metal such as Li or Cs, an alkaline-earth metal such as Mg, Ca, or Sr; or an alloy (Mg:Ag, Al:Li, or the like) containing these can be used. When a layer containing a material having a high electron injection property is formed so as to be in contact with the cathode 721, a usual conductive film of aluminum, an oxide conductive material, or the like can be used.

The anode 718, the electroluminescent layer 720, and the cathode 721 overlap with each other in the opening of the bank 719, and the overlapping portion corresponds to a light-emitting element 722.

Note that, after the light-emitting element 722 is formed, an insulating film may be formed over the cathode 721. Similarly to the insulating film 716, the insulating film is formed of a film which transmits a substance that causes to promote deterioration of a light-emitting element, such as moisture or oxygen as less as possible, compared with another insulating film. Typically, for example, it is preferable to use a DLC film, a carbon nitride film, a silicon nitride film formed by an RF sputtering method, or the like. The above-described film which transmits a substance such as moisture or oxygen as less as possible and a film which transmits a substance such as moisture or oxygen more than the film can be stacked and used as the above insulating film.

Note that, in FIGS. 15A and 15B, a structure in which light emitted from the light-emitting element 722 is emitted to a substrate 700 side is shown; however, a light-emitting element having a structure such that light is emitted to the side opposite to the substrate 700 may be used.

In practice, when a process is completed up to and including FIG. 15B, packaging (filling and sealing) is preferably performed by using a protective film (an attachment film, an ultraviolet curable resin film, or the like) which has small degas and high airtightness so as not to be further exposed to the outside air, or a light-transmitting cover member. At this time, when the inside of the cover member is made to be an inert atmosphere or a hygroscopic material (e.g., barium oxide) is arranged inside thereof, reliability of the light-emitting element can be improved.

This embodiment can be combined with the above embodiment modes and the above embodiments, as appropriate.

[Embodiment 5]

Figure 16A:
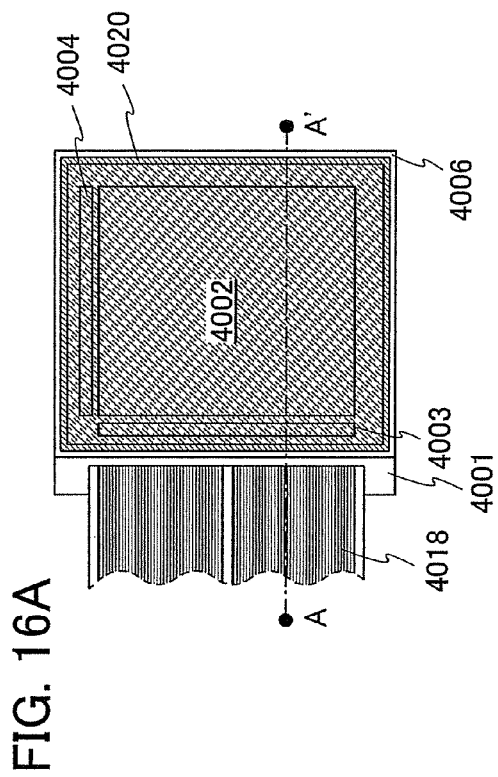
FIG. 16A is a top view and FIG. 16B is a cross-sectional view of a display device in accordance with an Embodiment of the present invention.

In this embodiment, a light emitting device which is one kind of a display device of the present invention is given as an example, and an external view thereof will be described with reference to FIGS. 16A and 16B. FIG. 16A is a top view of a panel in which a transistor and a light-emitting element which are formed over a first substrate are sealed with a sealant between the first substrate and a second substrate, and FIG. 16B corresponds to a cross-sectional view taken along line A-A' of FIG. 16A.

A sealant 4020 is provided so as to surround a pixel portion 4002, a signal line driver circuit 4003, and a scan line driver circuit 4004 which are provided over a first substrate 4001. A second substrate 4006 is provided over the pixel portion 4002, the signal line driver circuit 4003, and the scan line driver circuit 4004. Therefore, the pixel portion 4002, the signal line driver circuit 4003, and the scan line driver circuit 4004 as well as a filler 4007 are sealed using the sealant 4020 between the first substrate 4001 and the second substrate 4006.

The pixel portion 4002, the signal line driver circuit 4003, and the scan line driver circuit 4004 which are provided over the first substrate 4001 each include a plurality of transistors. In FIG. 16B, a transistor 4008 included in the signal line driver circuit 4003, and a driving transistor 4009 and a switching transistor 4010 which are included in the pixel portion 4002 are shown.

A light-emitting element 4011 uses part of a wiring 4017 connected to a source region or a drain region of the driving transistor 4009 as its pixel electrode. The light-emitting element 4011 includes a counter electrode 4012 and an electroluminescent layer 4013 as well as the pixel electrode. Note that a structure of the light-emitting element 4011 is not limited to the structure described in this embodiment. The structure of the light-emitting element 4011 can be changed as appropriate in accordance with a direction of light taken from the light-emitting element 4011, a polarity of the driving transistor 4009, or the like.

Figure 16B:
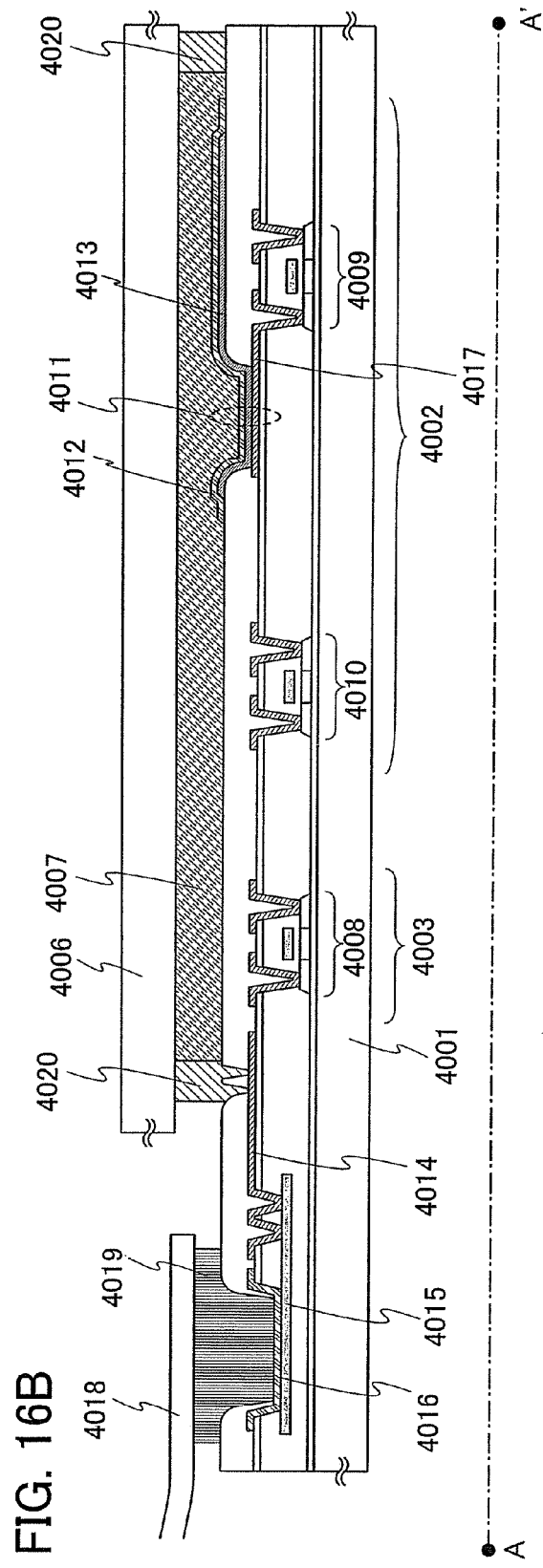

Although various signals and a voltage which are applied to the signal line driver circuit 4003, the scan line driver circuit 4004, or the pixel portion 4002 are not shown in the cross-sectional view of FIG. 16B, the various signals and the voltage are supplied from a connecting terminal 4016 through a leading wiring 4014 and a leading wiring 4015. A reverse bias voltage is applied to the scan line driver circuit 4004 from a threshold control circuit or a power supply control circuit through the leading wiring 4014 and the leading wiring 4015.

In this embodiment, the connecting terminal 4016 is formed of the same conductive film as the counter electrode 4012 included in the light-emitting element 4011. The leading wiring 4014 is formed of the same conductive film as the wiring 4017. The leading wiring 4015 is formed of the same conductive film as gate electrodes of the driving transistor 4009, the switching transistor 4010, and the transistor 4008.

The connecting terminal 4016 is electrically connected to a terminal included in an FPC 4018 through an anisotropic conductive film 4019.

Note that as the first substrate 4001 and the second substrate 4006, glass, a metal (typically, stainless steel), ceramics, or plastic can be used. However, the second substrate 4006 which is located in a direction from which light emitted from the light-emitting element 4011 is needed to have a light-transmitting property. Accordingly, it is preferable that the second substrate 4006 be formed of a light-transmitting material such as a glass plate, a plastic plate, a polyester film, or an acryl film.

As the filler 4007, an ultraviolet curable resin or a thermosetting resin as well as an inert gas such as nitrogen or argon can be used. In this embodiment, an example in which nitrogen is used as the filler 4007 is described.

This embodiment can be combined with the above embodiment modes and the above embodiments, as appropriate.

[Embodiment 6]

Figure 17A:
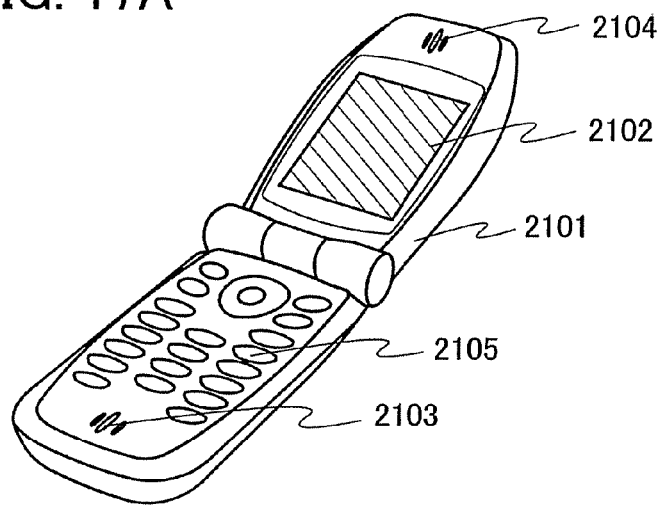
FIGS. 17A to 17C are diagrams of electronic devices using a display device in accordance with an Embodiment of the present invention.
Figure 17B:
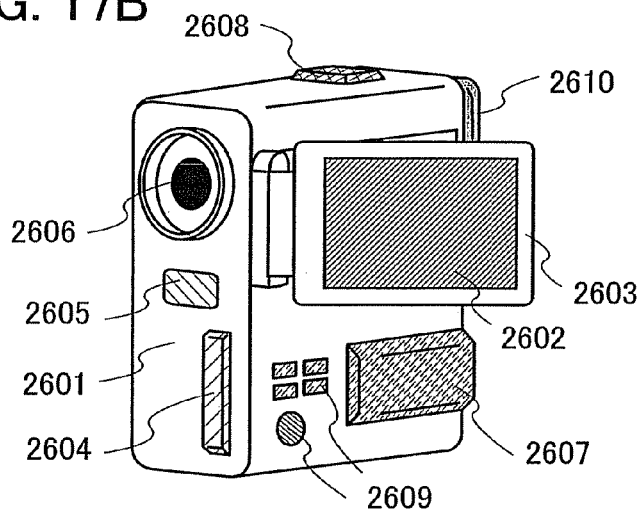
Figure 17C:
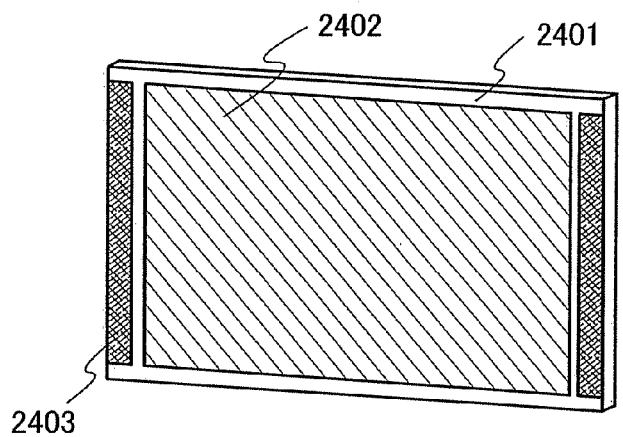
Figure 18A:
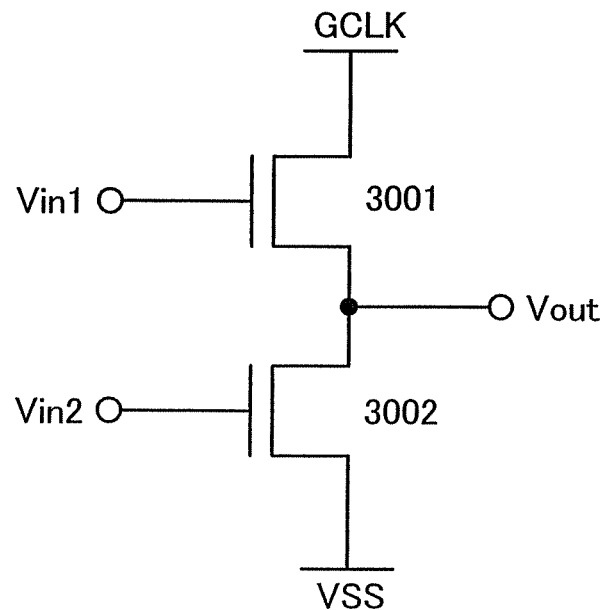
FIG. 18A is a circuit diagram of an output circuit and FIG. 18B a timing chart of the output circuit.
Figure 18B:
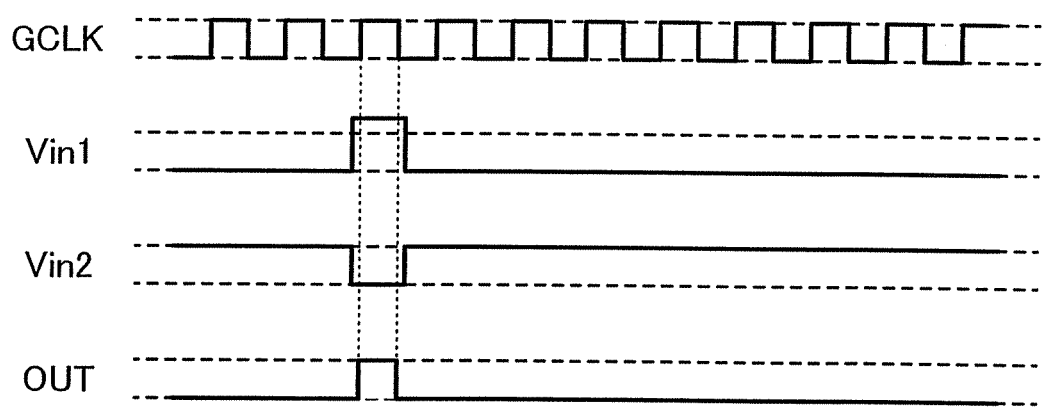

As an electronic device which can use the display device of the present invention, a cellular phone, a portable game machine, an e-book reader, a video camera, a digital still camera, a goggle display (a head mounted display), a navigation system, an audio reproducing device (e.g., a car audio or an audio component set), a laptop computer, an image reproducing device provided with a recording medium (typically, a device which reproduces a recording medium such as a digital versatile disc (DVD) and has a display that can display the reproduced image), and the like can be given. FIGS. 17A to 17C show specific examples of these electronic devices.

FIG. 17A shows a cellular phone, which includes a main body 2101, a display portion 2102, an audio input portion 2103, an audio output portion 2104, and operation keys 2105. By using the display device of the present invention for the display portion 2102, a cellular phone which has high reliability can be obtained.

FIG. 17B shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. By using the display device of the present invention for the display portion 2602, a video camera which has high reliability can be obtained.

FIG. 17C shows an image display device, which includes a housing 2401, a display portion 2402, a speaker portion 2403, and the like. By using the display device of the present invention for the display portion 2402, an image display device which has high reliability can be obtained. Note that the image display device corresponds to all image display devices which are used to display images, such as those for personal computers, television broadcast reception, and advertisement display.

As described above, the application range of the present invention is extremely wide and the present invention can be applied to electronic devices in all fields.

This embodiment can be combined with the above embodiment modes and the above embodiments, as appropriate.

This application is based on Japanese Patent Application serial No. 2007-098950 filed with Japan Patent Office on Apr. 5, 2007, and Japanese Patent Application serial No. 2007-226132 filed with Japan Patent Office on Aug. 31, 2007, the entire contents of which are hereby incorporated by reference.

What is claimed is:

1. A display device comprising:
a pixel comprising a first transistor;
an output circuit comprising a second transistor, one of a source and a drain of the second transistor is electrically connected to a gate of the first transistor through a scan line;
a power supply control circuit configured to apply one of a first voltage and a second voltage to a gate of the second transistor, and
a threshold control circuit configured to control the power supply control circuit,
wherein the other of the source and the drain of the second transistor is electrically and directly connected to a wiring supplied with a third voltage,
wherein the third voltage is higher than the first voltage and lower than the second voltage, and
wherein the threshold control circuit includes a measurement circuit configured to measure first time during which the second voltage is applied to the gate of the second transistor so that a forward bias voltage is applied to the second transistor, and an arithmetic circuit configured to calculate second time during which the first voltage is applied to the gate of the second transistor using the first time so that a reverse bias voltage is applied to the second transistor,
wherein a threshold voltage of the second transistor shifts in a reverse direction by applying the reverse bias voltage, and
wherein the reverse direction is opposite to a positive direction in which the threshold voltage of the second transistor shifts by applying the forward bias voltage.

2. The display device according to claim 1, wherein the second transistor is a thin film transistor.

3. The display device according to claim 1, wherein the second transistor is a thin film transistor using an insulating film having a higher dielectric constant than that of silicon oxide as a gate insulating film.

4. The display device according to claim 1, wherein the second transistor is an n-channel transistor.

5. The display device according to claim 1, wherein the second transistor is a p-channel transistor.

6. A display device comprising:
an output circuit comprising a transistor, one of a source and a drain of the transistor is electrically connected to a scan line;
a power supply control circuit configured to apply one of a first voltage and a second voltage to a gate of the transistor, and
a threshold control circuit configured to control the power supply control circuit,
wherein the other of the source and the drain of the transistor is electrically and directly connected to a wiring supplied with a third voltage,
wherein the third voltage is higher than the first voltage and lower than the second voltage, and
wherein the threshold control circuit includes a measurement circuit configured to measure first time during which the second voltage is selected so that a forward bias voltage is applied to the transistor, and an arithmetic circuit configured to calculate second time during which the first voltage is selected using the first time so that a reverse bias voltage is applied to the transistor, wherein a threshold voltage of the transistor shifts in a reverse direction by applying the reverse bias voltage, and wherein the reverse direction is opposite to a positive direction in which the threshold voltage of the transistor shifts by applying the forward bias voltage.

7. The display device according to claim 6, wherein the transistor is a thin film transistor.

8. The display device according to claim 6, wherein the transistor is a thin film transistor using an insulating film having a higher dielectric constant than that of silicon oxide as a gate insulating film.

9. The display device according to claim 6, wherein the transistor is an n-channel transistor.

10. The display device according to claim 6, wherein the transistor is a p-channel transistor.

11. A display device comprising:
a pixel comprising a first transistor;
an output circuit comprising a second transistor, one of a source and a drain of the second transistor is electrically connected to a gate of the first transistor through a scan line;
a power supply control circuit configured to apply one of a first voltage and a second voltage to a gate of the second transistor, and
a threshold control circuit configured to control the power supply control circuit,
wherein the other of the source and the drain of the second transistor is electrically and directly connected to a wiring supplied with a third voltage,
wherein the third voltage is higher than the first voltage and lower than the second voltage, and
wherein the threshold control circuit includes a measurement circuit configured to measure first time during which the second voltage is applied to the gate of the second transistor so that a forward bias voltage is applied to the second transistor, a memory in which data is to be used to calculate second time during which the first voltage is applied to the gate of the second transistor from the first time is stored, and an arithmetic circuit configured to calculate the second time using the first time and the data so that a reverse bias voltage is applied to the second transistor,
wherein a threshold voltage of the second transistor shifts in a reverse direction by applying the reverse bias voltage, and
wherein the reverse direction is opposite to a positive direction in which the threshold voltage of the second transistor shifts by applying the forward bias voltage.

12. The display device according to claim 11, wherein the memory is a nonvolatile memory.

13. The display device according to claim 11, wherein the second transistor is a thin film transistor.

14. The display device according to claim 11, wherein the second transistor is a thin film transistor using an insulating film having a higher dielectric constant than that of silicon oxide as a gate insulating film.

15. The display device according to claim 11, wherein the second transistor is an n-channel transistor.

16. The display device according to claim 11, wherein the second transistor is a p-channel transistor.

17. A display device comprising:
an output circuit comprising a transistor, one of a source and a drain of the transistor is electrically connected to a scan line;
a power supply control circuit configured to apply one of a first voltage and a second voltage to a gate of the transistor, and
a threshold control circuit configured to control the power supply control circuit,
wherein the other of the source and the drain of the transistor is electrically and directly connected to a wiring supplied with a third voltage,
wherein the third voltage is higher than the first voltage and lower than the second voltage, and
wherein the threshold control circuit includes a measurement circuit configured to measure first time during which the second voltage is selected so that a forward bias voltage is applied to the transistor, a memory in which data is to be used to calculate second time during which the first voltage is selected from the first time is stored, and an arithmetic circuit configured to calculate the second time using the first time and the data so that a reverse bias voltage is applied to the transistor,
wherein a threshold voltage of the transistor shifts in a reverse direction by applying the reverse bias voltage, and
wherein the reverse direction is opposite to a positive direction in which the threshold voltage of the transistor shifts by applying the forward bias voltage.

18. The display device according to claim 17, wherein the memory is a nonvolatile memory.

19. The display device according to claim 17, wherein the transistor is a thin film transistor.

20. The display device according to claim 17, wherein the transistor is a thin film transistor using an insulating film having a higher dielectric constant than that of silicon oxide as a gate insulating film.

21. The display device according to claim 17, wherein the transistor is an n-channel transistor.

22. The display device according to claim 17, wherein the transistor is a p-channel transistor.

23. The display device according to claim 1, wherein the second voltage is applied to the gate of the second transistor when the pixel does not display an image.

24. The display device according to claim 11, wherein the second voltage is applied to the gate of the second transistor when the pixel does not display an image.

* * * * *

UNITED STATES PATENT AND TRADEMARK OFFICE
CERTIFICATE OF CORRECTION

| | |
|---|---|
| PATENT NO. | : 8,552,948 B2 |
| APPLICATION NO. | : 12/052307 |
| DATED | : October 8, 2013 |
| INVENTOR(S) | : Miyake et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1027 days.

Signed and Sealed this
Third Day of March, 2015

Michelle K. Lee
*Deputy Director of the United States Patent and Trademark Office*